(12) United States Patent
Aziz et al.

(10) Patent No.: US 12,477,885 B2
(45) Date of Patent: Nov. 18, 2025

(54) LIGHT EMITTING ARRAY

(71) Applicant: Plessey Semiconductors Limited, Plymouth (GB)

(72) Inventors: Mohsin Aziz, Plymouth (GB); Jun-Youn Kim, Plymouth (GB); Abdul Shakoor, Plymouth (GB); James Carswell, Plymouth (GB); Anwer Saeed, Plymouth (GB); Kevin Stribley, Plymouth (GB)

(73) Assignee: Plessey Semiconductors Limited, Plymouth (GB)

( * ) Notice: Subject to any disclaimer, the term of this patent is extended or adjusted under 35 U.S.C. 154(b) by 429 days.

(21) Appl. No.: 18/010,622

(22) PCT Filed: Jun. 23, 2021

(86) PCT No.: PCT/EP2021/067222
§ 371 (c)(1),
(2) Date: Dec. 15, 2022

(87) PCT Pub. No.: WO2022/002727
PCT Pub. Date: Jan. 6, 2022

(65) Prior Publication Data
US 2023/0299119 A1    Sep. 21, 2023

(30) Foreign Application Priority Data
Jul. 1, 2020    (GB) .................................... 2010064

(51) Int. Cl.
*H10H 29/14*    (2025.01)
(52) U.S. Cl.
CPC .................................. *H10H 29/142* (2025.01)
(58) Field of Classification Search
CPC .. H10H 29/142; H10H 20/857; H10H 20/819; H10H 20/825; H10H 20/018;
(Continued)

(56) References Cited

U.S. PATENT DOCUMENTS 10,325,894 B1    6/2019    Pan
10,937,924 B2 *  3/2021    Zou ..................... H10H 20/831
(Continued)

FOREIGN PATENT DOCUMENTS

EP    3840066 A1    6/2021
WO    20180175338 A1    9/2018

OTHER PUBLICATIONS

International Search Report for Application No. PCT/EP2021/067222, mailed Nov. 8, 2021, 12 pages.
(Continued)

*Primary Examiner* — Ratisha Mehta
(74) *Attorney, Agent, or Firm* — Stinson LLP

(57) ABSTRACT

According to the first aspect of the disclosure, a method of forming a light emitting device array precursor is provided. The method comprises forming a first light emitting layer on a first substrate, forming an array of first light emitting devices from the first light emitting layer, each first light emitting device configured to emit light having a first wavelength. A first bonding layer is formed on the first light emitting layer. A second light emitting layer is formed on a second substrate, the second light emitting layer configured to emit light having a second wavelength different to the first wavelength. A second bonding layer is formed on the second light emitting layer. The second bonding layer is bonded to a handling substrate, followed by removing the second substrate from the second light emitting layer. A third bonding layer is formed on the second light emitting layer on an opposite side of the second light emitting layer to the handling layer. The first bonding layer is bonded to the third bonding layer and the handling substrate is removed from the second light emitting layer. An array of second light emitting devices is formed from the second light emitting layer, the array of second light emitting devices aligned relative to the array of first light emitting devices such that (Continued)

they are spaced apart from each other in a plane parallel to each of the first and second light emitting layers.

18 Claims, 15 Drawing Sheets

(58) Field of Classification Search
CPC ............... H10H 20/013; H10H 20/812; H01L 25/0753; H01L 25/0756; H01L 25/50
See application file for complete search history.

(56) References Cited

U.S. PATENT DOCUMENTS

| | | |
|---|---|---|
| 2011/0097831 A1* | 4/2011 | Chung ............... H10H 20/018 438/46 |
| 2016/0163940 A1* | 6/2016 | Huang ............... H10H 20/857 257/89 |
| 2017/0288093 A1 | 10/2017 | Cha et al. |
| 2019/0139949 A1 | 5/2019 | Liu et al. |
| 2019/0229234 A1 | 7/2019 | Zou et al. |
| 2019/0287949 A1 | 9/2019 | Chong et al. |
| 2020/0058824 A1 | 2/2020 | Jang et al. |

OTHER PUBLICATIONS

Great Britain Combined Search and Examination Report for Application No. GB 2010064.0, dated Dec. 24, 2020, 7 pages.
Ghodssi R., et al, "MEMS Materials and Processes Handbook," (2011), Springer Science+Business Media, LLC, Ch. 11, 65 pages.

* cited by examiner

LIGHT EMITTING ARRAY

REFERENCE TO RELATED APPLICATIONS

This application is a 371 U.S. National Stage Application of International Patent Application No. PCT/EP2021/067222, filed Jun. 23, 2021, which claims the benefit of GB Application No. 2010064.0, filed Jul. 1, 2020, the entire disclosures of which are incorporated herein by reference.

FIELD OF THE DISCLOSURE

The present disclosure relates to an array of light emitting devices. In particular, the present disclosure relates to an array of light emitting devices comprising Group III-nitrides.

BACKGROUND

Micro LED arrays are commonly defined as arrays of LEDs with a surface area of 100×100 μm or less. Micro LED arrays are self-emitting micro-displays/projectors which may be suitable for use in a variety of devices such as smartwatches, head-wearing displays, head-up displays, camcorders, viewfinders, multisite excitation sources, and pico-projectors.

One known form of a micro-LED array comprises a plurality of LEDs formed from Group III-nitrides. Group III-nitride LEDs are inorganic semiconductor LEDs containing GaN and its alloys with InN and AlN in the active light-emitting region. Group III-nitride LEDs can be driven at significantly higher current density and emit a higher optical power density than conventional large-area LEDs, for example organic light emitting diodes (OLED) in which the light-emitting layer is an organic compound. As a result, higher luminance (brightness), defined as the amount of light emitted per unit area of the light source in a given direction, makes micro LEDs suitable for applications requiring or benefiting from, high brightness. For example, applications which benefit from high brightness may include displays in high brightness environments or projectors. Additionally, Group III-nitride micro LEDs are known to have relatively high luminous efficacy, expressed in lumens per watt (lm/W) compared to other conventional large area LEDs. The relatively high luminous efficacy of Group III-nitride micro LED arrays reduces power usage compared with other light sources and makes micro LEDs particularly suitable for portable devices.

Techniques for fabricating single colour (blue) GaN monolithic micro-LED arrays are known in the art. To produce a full-colour micro-LED based-display requires the integration of red and green sub-pixels into the display. One method for forming full-colour displays is to provide an LED array comprising a plurality of different LEDs each configured to output one or e.g. red, green and blue light. If the full colour spectrum is generated directly by electroluminescence rather than through the use of colour converting materials such as phosphors or quantum dots, such LED arrays are commonly known as 'native' LED arrays. For small pitch devices, such as micro-LED arrays, conventional pick and place methods for assembling an array of red, green, and blue LEDs are limited due to yield and throughput constraints.

It is an object of the present invention to provide an improved method of forming a light emitting device array precursor which tackles at least one of the problems associated with prior art methods or, at least, provide a commercially useful alternative thereto.

SUMMARY

According to the first aspect of the disclosure, a method of forming a light emitting device array precursor is provided. The method comprises:
    forming a first light emitting layer on a first substrate, the first light emitting layer configured to emit light having a first wavelength;
    forming an array of first light emitting devices from the first light emitting layer, each first light emitting device configured to emit light having a first wavelength;
    forming a first bonding layer on the first light emitting layer;
    forming a second light emitting layer on a second substrate, the second light emitting layer configured to emit light having a second wavelength different to the first wavelength;
    forming a second bonding layer on the second light emitting layer;
    bonding the second bonding layer to a handling substrate;
    removing the second substrate from the second light emitting layer;
    forming a third bonding layer on the second light emitting layer on an opposite side of the second light emitting layer to the handling layer;
    bonding the first bonding layer to the third bonding layer;
    removing the handling substrate from the second light emitting layer;
    forming an array of second light emitting devices from the second light emitting layer, the array of second light emitting devices aligned relative to the array of first light emitting devices such that the light emitting device array precursor comprises an array of first and second light emitting devices which are spaced apart from each other in a plane parallel to each of the first and second light emitting layers.

According to the method of the first aspect, first and second light emitting layers may be formed on separate respective first and second substrates. By forming the first and second light emitting layers on different substrates, the respective formation processes may be adapted to allow the first and second light emitting layer to emit different (first and second) wavelengths of light. For example, in some embodiments, the first wavelength may be generally blue visible light, while the second wavelength may be generally red or green visible light.

By a series of substrate bonding processes, the second light emitting layer may be bonded on the first light emitting layer. As the array of second light emitting devices is not yet patterned on to the second light emitting layer, the process of bonding the second light emitting layer with the first light emitting layer is relatively straightforward, as the bonding step does not require precise mechanical alignment of the two light emitting layers. Once the two light emitting layers are bonded together, the array of second light emitting devices may be formed from the second light emitting layer. By performing the patterning on the second light emitting devices after the light emitting layers are bonded, the method of the first aspect may achieve improved alignment tolerances than would be possible with mechanical alignment of the respective layers.

By performing the substrate bonding steps after the light emitting layers have been formed, the method according to the first aspect avoids exposing the first light emitting layer to the initial processing conditions for forming the second light emitting layer. For example, the first light emitting layer may not be exposed to any substrate heating provided as part of the process of forming (i.e. depositing) the second light emitting layer, as this is performed on the second substrate.

As such, the method according to the first aspect avoids subjecting the first light emitting layer to any further processes for forming other light emitting layers of the light emitting device array precursor. For example, it has been observed that p-type GaN surfaces in masked regions of a light emitting array precursor may decompose during subsequent high temperature deposition of following light emitting device layers, thereby compromising the anode contact to junctions deposited in earlier steps.

The method according to the first aspect provides a light emitting device array precursor having an array of "native" first and second light emitting devices. The light first and second light emitting devices are spaced apart from each other to provide an image plane (i.e. a plane parallel to each of the first and second light emitting layers) in which each of the first and second light emitting devices are spaced apart from each other. Of course, it will be appreciated that the first light emitting devices are also spaced apart from the second light emitting devices in a direction normal to the image plane due to the bonding of the first and second light emitting layers as part of the method of forming the light emitting device array precursor. Such a light emitting device array precursor, having first and second light emitting devices spaced apart in an image plane (i.e. arranged as an array) may be suitable for the formation of a light emitting device display, or a light emitting device projector.

By the term precursor in light emitting device array precursor, it is noted that the light emitting device array precursor described does not necessarily include the electrical contacts for each light emitting device such as to allow the emission of light, nor the associated circuitry. Of course, the light emitting device array precursor formed according to the first aspect (and also the light emitting device array precursor of the second aspect) does not preclude the addition of further electrical contacts and associated circuitry. As such, use of the term precursor in this disclosure is intended to include the finalized product (i.e. a light emitting array).

By the term array in the light emitting device array precursors of this disclosure, it is intended to refer to a plurality of light emitting devices that are intentionally spaced across a structure. Typically, said light emitting devices form a regular array, such as a hexagonally close-packed array or a square-packed array of light emitting devices.

In some embodiments, the first light emitting layer comprises a plurality of layers, each layer comprising a Group-III nitride. In some embodiments, the second light emitting layer comprises a plurality of layers, each layer comprising a Group-III nitride. As such, the first light emitting layer, and/or the second light emitting layer may comprise a heterostructure junction. By forming such heterostructure junctions on a respective first and/or second substrate, the in-plane lattice constant of said first and/or second substrate may be tailored to the in-plane lattice constant of the respective heterostructure in order to reduce defects forming in the hetero-structure as a result of strain. As such, the overall efficiency of the devices formed from the respective first and/or second light emitting layers may be improved.

In some embodiments, forming the first light emitting layer comprises forming a first n-type semiconducting layer on the first substrate, forming a first active layer on the first n-type semiconducting layer, and forming a first p-type semiconducting layer on the first active layer. The first active layer may comprise a plurality of quantum well layers. Each quantum well layer may be configured to emit light of the first wavelength. As such, the first light emitting layer may comprise a plurality of layers configured to produce a light emitting semiconductor junction. The semiconducting junction may be configured to generate light having a peak wavelength corresponding to the first wavelength.

In some embodiments, forming the array of first light emitting devices comprises forming a first mesa structure for each first light emitting device. The first mesa structures may extend in a direction normal to the first substrate. Each first mesa structure may comprise a portion of the first n-type layer, the first active layer, and the first p-type semiconducting layer. As such, the light emitting semiconducting junction may be formed within the first mesa structure of each first light emitting device. Forming a first mesa structure for each light emitting device may help to confine charge carriers within the mesa structure, thereby improving the internal quantum efficiency of the light emitting device.

In some embodiments, forming the second light emitting layer comprises forming a second n-type semiconducting layer on the second substrate, forming a second active layer on the second n-type semiconducting layer, and forming a second p-type semiconducting layer on the second active layer. The second active layer may comprise a plurality of quantum well layers configured to emit light of the second wavelength. As such, the second light emitting layer may comprise a semiconducting junction configured to generate light having a peak wavelength corresponding to the second wavelength.

In some embodiments, following removal of the second substrate, and prior to the formation of the third bonding layer, the method may further comprise selectively removing a portion of the second n-type semiconducting layer such that a thickness of the second N-type semiconducting layer in a direction normal to the first substrate is no greater than 2 µm. As such, the second n-type semiconducting layer may be thinned from an as-deposited thickness greater than 2 µm down to a thickness which is no greater than 2 µm prior to bonding to the first bonding layer. In some embodiments, it may be desirable to form the second n-type semiconducting layer having an as-deposited thickness greater than 2 µm in order to improve the properties of the second active layer and second p-type semiconducting layer which are formed on the second n-type semiconducting layer. The thickness of the second n-type semiconducting layer may subsequently be thinned down to a more suitable thickness for bonding to the first bonding layer.

In some embodiments, the step of bonding the second bonding layer to the handling substrate, and the step of bonding the first bonding layer to the third bonding layer may be performed using tap bonding, oxide bonding, or adhesive (polymer) bonding.

The first bonding layer may be provided over the first light emitting layer in order to provide a first bonding surface for the first light emitting layer. The first bonding surface may provide a substantially planar surface suitable for bonding to another substrate (i.e. to the third bonding layer). As such, the first bonding layer may be provided to cover any electrical contacts which may have been formed to the first light emitting layer (i.e. to planarise the first light emitting layer).

In some embodiments, forming the array of second light emitting devices from the second light emitting layer comprises forming a second mesa structure for each second light emitting device. The second mesa structures may each extend in a direction normal to the first substrate. Each second mesa structure may comprise a portion of the second N-type semiconducting layer, the second active layer, and the second P-type semiconducting layer.

In some embodiments, the method further comprises forming electrical contacts to each of the first light emitting devices and each of the second light emitting devices.

In some embodiments, the method further comprises forming electrical contacts to each of the first light emitting devices and each of the second light emitting devices comprising forming a common cathode contact to each of the first and second light emitting devices. As such, a common cathode may be provided for each of the first and second light emitting devices in an efficient manner.

In some embodiments, the first bonding layer comprises a dielectric material, and the second bonding layer comprises a dielectric material. In some embodiments, bonding the first boding layer to the second bonding layer comprises direct (or tap) bonding the first bonding layer to the second bonding layer by applying pressure and heat. As such, the first bonding layer may be bonded to the second bonding layer using a bonding technique which does not require precise mechanical alignment of the first and second substrates.

In some embodiments, the first wavelength is at least 440 nm, and no greater than 490 nm. In some embodiments, the second wavelength is at least 500 nm, and no greater than 680 nm. As such, the first wavelength may be substantially blue visible light. In some embodiments, the second wavelength may be substantially green or red visible light. Of course, in other embodiments, the first and second wavelengths may be different wavelengths of light, for example, the first wavelength may be red, green or blue light, and the second wavelength may also be red, green or blue light. In some embodiments, the first and/or second wavelength may be other wavelengths of light which are not visible, for example, ultraviolet or infrared.

In some embodiments, a first light emitting layer may be bonded to a second light emitting layer. In other embodiments, more than two light emitting layers may be bonded together.

For example, in some embodiments, three light emitting layers may be bonded together. Such a method according to the first aspect may further comprise:
  forming a fourth bonding layer on the second light emitting layer;
  forming a third light emitting layer on a third substrate, the third light emitting layer configured to emit light having a third wavelength different to the first wavelength and different to the second wavelength;
  forming a fifth bonding layer on the third light emitting layer;
  bonding the fifth bonding layer to a further handling substrate;
  removing the third substrate from the third light emitting layer;
  forming a sixth bonding layer on the third light emitting layer on an opposite side of the third light emitting layer to the further handling layer;
  bonding the fourth bonding layer to the sixth bonding layer;
  removing the further handling substrate from the third light emitting layer;
  forming an array of third light emitting devices from the third light emitting layer, the array of third light emitting devices aligned relative to the array of first light emitting devices and the array second light emitting device such that the light emitting device array precursor comprises an array of first second, and third light emitting devices which are spaced apart from each other.

In some embodiments, the third light emitting layer comprises a plurality of layers, each layer comprising a Group III-nitride. In some embodiments, forming the array of third light emitting devices comprises forming a third mesa structure for each third light emitting device. In some embodiments, forming the third light emitting layer comprises: forming a third n-type semiconducting layer on the third substrate, forming a third active layer on the first n-type semiconducting layer, the third active layer comprising a plurality of quantum well layers configured to emit light of the third wavelength, and forming a third p-type semiconducting layer on the third active layer.

In some embodiments, the light emitting device array precursor may provide first, second (and optionally third) light emitting devices which are each micro light emitting devices. As such, the surface area (or footprint) of each first, second, or third micro light emitting device in a plane parallel to the first substrate/first bonding layer may be no greater than 100 µm×100 µm. For example, in some embodiments the surface area (or footprint) of each first second or third mesa structure in a plane parallel to the first substrate may be no greater than 100 µm×100 µm. In some embodiments, the surface area of each first second or third mesa structure may be no greater than: 50 µm×50 µm, 30 µm×30 µm or 20 µm×20 µm, 10 µm×10 µm, 4 µm×4 µm, or 2 µm×2 µm.

In some embodiments, the first, second (and optionally third) (micro) light emitting devices may be arranged in the respective light emitting layers in order to provide an image plane wherein a pitch (measured between the centres of each first, second or third micro light emitting device) between adjacent light emitting devices is no greater than: 100 µm, 50 µm, 30 µm, 20 µm, 10 µm, 4 µm, or 2 µm.

According to a second aspect of the disclosure, a light emitting device array precursor is provided. The light emitting array precursor comprises a first light emitting layer, a first bonding layer, a second bonding layer, and a second light emitting layer. The first light emitting layer comprises an array of first light emitting devices. Each first light emitting device is configured to emit light having a first wavelength. The first bonding layer is provided on the first light emitting layer. The second bonding layer is bonded to the first bonding layer. The second light emitting layer is provided on the second bonding layer. The second light emitting layer comprises an array of second light emitting devices. Each second light emitting device is configured to emit light having a second wavelength different to the first wavelength. The array of second light emitting devices are aligned relative to the array of first light emitting devices such that the light emitting device array precursor comprises an array of first and second light emitting devices which are laterally spaced apart from each other in a plane parallel to each of the first and second light emitting layers.

Accordingly, light emitting array precursors according to the second aspect of the disclosure may be formed by the method according to the first aspect of the disclosure.

According to the first and second aspects, the first light emitting layer and/or the second light emitting layer and/or the third light emitting layer may comprise a plurality of Group-III nitrides. For example, the Group-III nitrides may comprise one or more AlInGaN, AlGaN, InGaN and GaN.

As used herein, any reference to a species by its constituent components includes all available stoichiometries thereof. Thus, for example, AlGaN includes all alloys thereof, such as $Al_xGa_{1-x}N$ wherein $0<X<1$. Preferred stoichiometries will vary depending on the function of the specific layer.

BRIEF DESCRIPTION OF FIGURES

The invention will now be described in relation to the following non-limiting figures. Further advantages of the disclosure are apparent by reference to the detailed description when considered in conjunction with the figures, which are not to scale so as to more clearly show the details. Like reference numbers indicate like elements throughout the several views, wherein.

DETAILED DESCRIPTION

The present invention will now be further described. In the following passages, different aspects of the invention are defined in more detail. Each aspect so defined may be combined with any other aspect or aspects unless clearly indicated to the contrary. In particular, any feature indicated as being preferred or advantageous or optional may be combined with any other feature or features indicated as being preferred or advantageous or optional.

Embodiments of this disclosure describe light emitting device array precursors and methods of forming light emitting device array precursors with various structural configurations for the purpose of simplifying and reducing the cost of forming a light emitting device array having a plurality of different emission wavelengths. Embodiments of this disclosure may relate to micro light emitting device array precursors and/or micro light emitting device arrays. Micro light emitting device arrays are commonly defined as arrays of light emitting devices (such as light emitting diodes) with a size of $100\times100$ $\mu m^2$ or less. According to an embodiment of this disclosure, a method of forming a light emitting device array precursor 100 is provided.

As part of the method of forming the light emitting device array precursor a first light emitting layer 20 is formed on a first substrate 10. An example of such intermediate structure is shown in FIG. 1.

Figure 1:
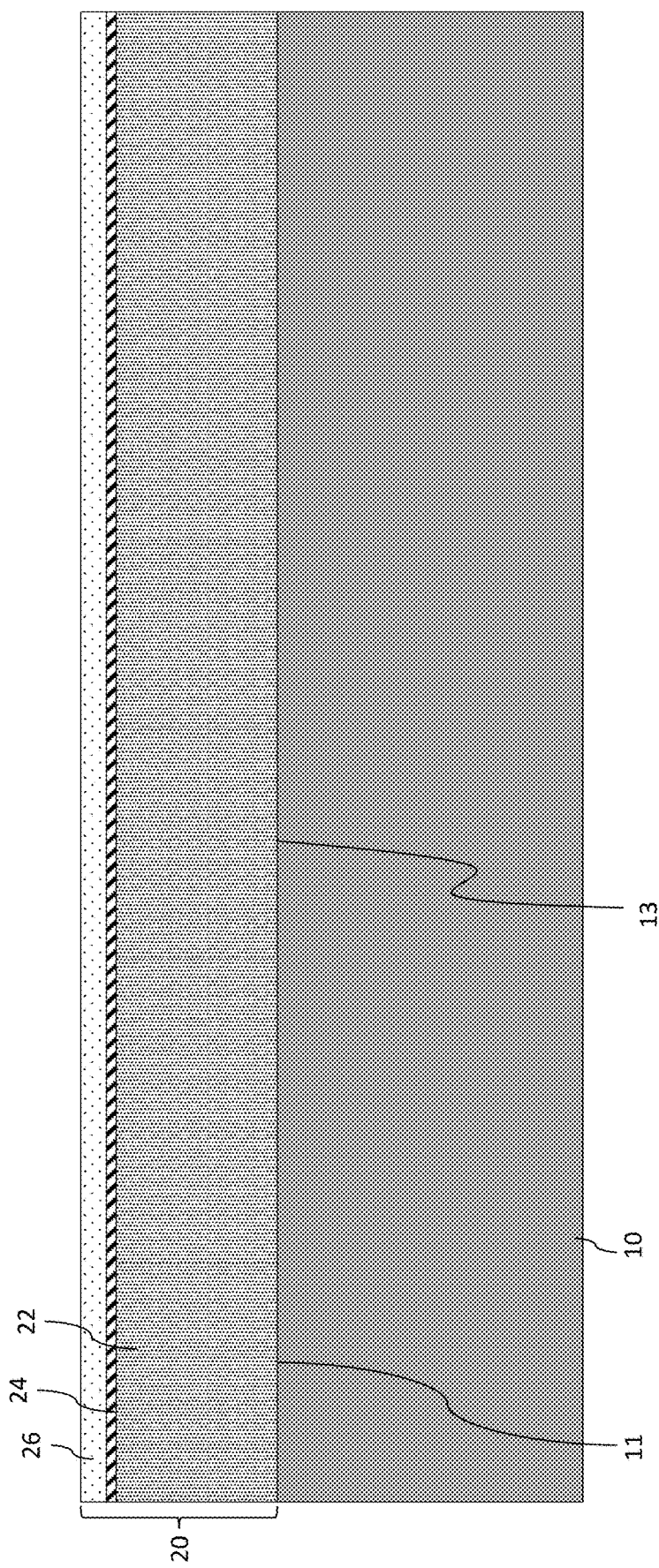
FIG. 1 shows a cross-section of a first light emitting layer formed in a first substrate.

As shown in FIG. 1, a first light emitting layer 20 is provided on a substrate surface 11 of the substrate 10. The substrate 10 may be any suitable substrate for fabricating Group-III nitrides thereon. For example, the substrate 10 may comprise silicon, sapphire, or SiC, or any other suitable substrate for the fabrication of thin film electronics.

As shown in FIG. 1, the first light emitting layer 20 may comprise a plurality of layers. In the embodiment of FIG. 1, each layer of the first light emitting layer 20 may comprise a Group-III nitride. For example, in the embodiment of FIG. 1 the first light emitting layer 20 comprises an n-type semiconducting layer 22, an active layer 24, and a p-type semiconducting layer 26. The plurality of layers 22, 24, 26 of the first light emitting layer 20 are formed upon each other in a stack to form the first light emitting layer 20. As such, the plurality of layers of the first light emitting layer 20 each extend across the substrate surface as substantially continuous layers. As such, the first light emitting layer 20 may be formed as a substantially continuous layer on the substrate surface 11.

The first light emitting layer 20 comprises a plurality of Group-III nitride layers such that the first light emitting layer 20 forms a semiconductor junction configured to output light having a first wavelength. As will be discussed further below, the first light emitting layer 20 may be subjected to further processing steps such that it comprises an array of first light emitting devices, wherein each first light emitting device is configured to emit light having the first wavelength. Each light emitting device of the first light emitting layer 20 may comprise a semiconducting junction, such as a diode, having a p-type side and an n-type side. In the embodiment of FIG. 1, the first light emitting layer 20 comprises a first active layer 24 arranged between a first n-type semiconducting layer 22 and a first p-type semiconducting layer 26. Of course, in other embodiments, the first light emitting layer 20 may comprise additional layers such as a first electron-blocking layer or other strain interface layers, as are known in the art.

As shown in FIG. 1, the first n-type semiconducting layer 22 may be formed as a substantially continuous layer across the substrate surface 11. In the embodiment of FIG. 1, the first n-type semiconducting layer 22 may comprise GaN. In some embodiments, such as in FIG. 1, the first n-type semiconducting layer 22 may comprise any suitable n-type dopant (i.e. an electron donor), such as Si or Ge. In the embodiment of FIG. 1, the first n-type semiconducting layer 22 is doped with a donor density of at least $10^{17}$ cm$^{-3}$, and in some embodiments no greater than $10^{19}$ cm$^{-3}$.

The first n-type semiconducting layer 22 may be deposited using any suitable process for the fabrication of Group-III nitride thin films, for example metal organic chemical vapour deposition (MOCVD), or molecular beam epitaxy (MBE).

The first n-type semiconducting layer 22 may be formed with a thickness in a direction normal to the first substrate surface 11 of at least 3 μm. Such a thickness provides improved material thickness to accommodate the subsequent formation of cathode contacts. Further, such a thickness allows for the formation of light extraction features 70 following removal of the first substrate 10 (discussed in more detail below. In some embodiments, the first n-type semiconducting layer 22 may have a thickness of no greater than 10, or more preferably 5 μm.

As shown in FIG. 1, the first active layer 24 is formed as a substantially continuous layer on the first n-type semiconducting layer 22. The first active layer 24 is configured to generate light of the first wavelength as part of the first light emitting layer 20.

In the embodiment of FIG. 1, the first active layer 24 may comprise one or more quantum well layers. As such, the first active layer 24 may be multiple quantum well layer. The quantum well layers within the first active layer 24 may comprise a Group-III nitride semiconductor preferably a Group-III nitride alloy including In. For example, in the embodiment of FIG. 1, the first active layer 24 may comprise alternating layers of GaN and $In_YGA_{1-Y}N$, where $0<Y≤1$. In particular, in some embodiments the first active layer 24 may comprise InGaN layers where the indium content Y is $0<Y≤0.2$. As such, the first active layer 24 of the first light emitting layer 20 may be configured to generate light having a wavelength of at least 280 nm, and no greater than 490 nm (i.e. generally blue visible light). In this disclosure, reference to a specific wavelength of light emitted by a light emitting device is taken to be a reference to a peak wavelength emitted by the light emitting device. The thickness and indium content (Y) of the quantum well layer may be controlled in order to control the wavelength of light generated by the first active layer 24. The first active layer 24 may be formed as a continuous layer covering a substantial portion (e.g. all) of the surface of the first n-type semiconducting layer 22.

The first active layer 24 may be deposited using any suitable process for the fabrication of Group-III nitride thin films, for example metal organic chemical vapour deposition (MOCVD), or molecular beam epitaxy (MBE).

As shown in FIG. 1, a first p-type semiconducting layer 26 is provided over the first active layer 24. The first p-type semiconducting layer 26 is provided on a side of the first active layer 24 opposite the side of the first active layer 22 on which the first n-type semiconducting layer 22 is provided. The first p-type semiconducting layer 26 comprises a Group-III nitride, for example GaN. The first p-type semiconducting layer 26 is doped with a suitable electron acceptor, for example Mg. The first p-type semiconducting layer 26 may have an acceptor density of at least $10^{19}$ cm$^{-3}$. In some embodiments, the first p-type semiconducting layer 26 may have an acceptor density of no greater than $10^{21}$ cm$^{-3}$. The first p-type semiconducting layer 26 may be formed as a continuous layer covering a substantial portion (e.g. all) of the exposed surface of the first active layer 24. In some embodiments, each of the layers of the first light emitting layer 20 may be formed using any suitable process for the fabrication of Group-III nitride thin films for example MOCVD, or MBE.

Figure 2:
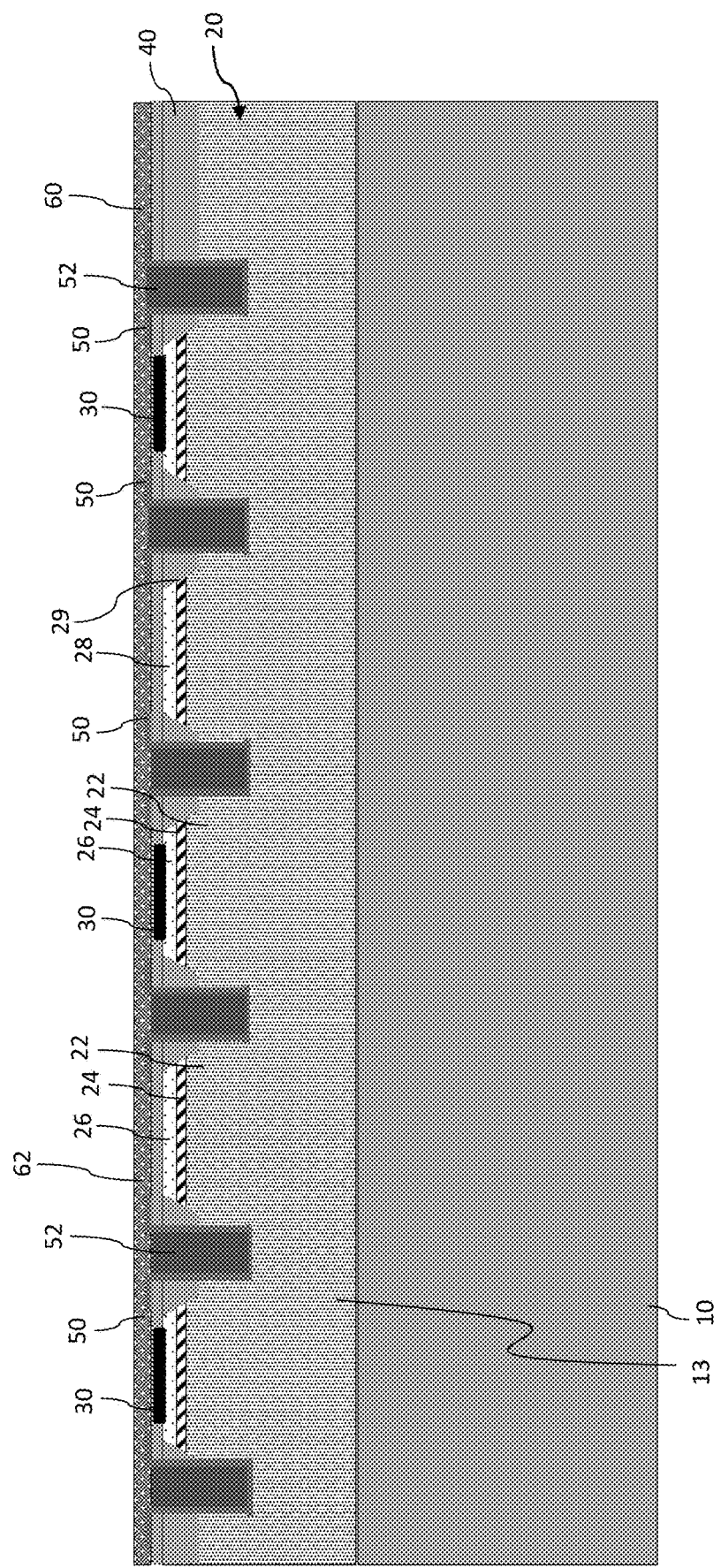
FIG. 2 shows a cross-sectional diagram of a first light emitting layer with a first bonding layer formed thereon.

Next, as shown in FIG. 2, an array of first light emitting devices may be formed in the first light emitting layer 20. As shown in FIG. 2, forming the array of first light emitting devices comprises forming a first mesa structure 28 for each light emitting device within the first light emitting layer 20. As shown in FIG. 2, the first mesa structures 28 each extend in a direction normal to the first substrate 10. Each first mesa structure 28 comprises a portion of the first n-type semiconducting layer 22, a portion of the first active layer 24, and a portion of the first p-type semiconducting layer 26. As shown in FIG. 2, each second mesa structure 28 has a generally trapezoidal cross-section in a plane normal to the first substrate surface 11. As such, each mesa structure 28 comprises a generally planar first mesa surface 27 which is aligned with the surface of the first substrate 10. Each first mesa structure 28 also comprises first sidewall surfaces 29 which surrounds the first mesa surface 27. The first sidewall surface 29 of each mesa structure extend in a direction generally transverse to the first substrate surface 11. In the embodiment of FIG. 1, the first sidewall surfaces 29 are inclined relative to the normal to the first substrate surface 11 such that the inclined first sidewall surfaces 29 define the trapezoidal cross-section.

As shown in FIG. 2, the first mesa structures 28 are spaced apart across the first light emitting layer 20 in order to form a regular spaced array of light emitting devices. The first mesa structures 28 are formed by selectively removing a portion of the first light emitting layer 20 using a selective removal process.

For example, in FIG. 2, the selective removal process is provided by an etching process. In the etching process, a first mask layer (not shown) may be deposited on the exposed surface of the p-type semiconducting layer 26. The first mask layer is configured to mask a portion of the first light emitting layer 20 which is intended to form the first mesa structures 28. As such, the first mask layer may define one or more regions which are intended to be selectively removed in order to form the first mesa structures 28. Portions of the first light emitting layer 20 which are exposed by the first mask layer may then be selectively removed using an etchant. As shown in FIG. 2, the etchant may etch away portions of the first p-type semiconducting layer 26, the first active layer 24 and the first n-type semiconducting layer 22 to define the first mesa structures 28. The first mask layer may be provided using any known method in the art. For example, the first mask layer may be formed and patterned using a lithography method.

As discussed above, each first mesa structure 28 may be formed by etching the first light emitting layer 20 in a thickness direction normal to the first substrate surface 11. Accordingly, each first mesa structure 28 formed may have a thickness in the thickness direction of at least 0.3 μm, or in some embodiments, at least 0.5 μm, 0.7 μm, or 1 μm.

As noted above, each first mesa structure 28 may be formed such that the first light emitting layer 20 comprises an array of first micro light emitting devices. As such, the surface area (or footprint) of each first micro light emitting device in a plane parallel to the first substrate may be no greater than 100 μm×100 μm. In some embodiments, a pitch (measured between the centres of each first micro light emitting device) for each first micro light emitting device may be no greater than: 100 μm, 50 μm, 30 μm, 20 μm, 10 μm, 4 μm, or 2 μm. It will be appreciated that the second mesa structures 128 and third mesa structures 228 discussed in further detail below may also be formed with similar dimensions in order to provide an array of micro light emitting devices.

Following the formation of the array of first mesa structures 28, electrical contacts may be formed to the n-type side and the p-type side of the each of the light emitting devices in the first light emitting layer 20.

For example, a first anode layer may be formed on the array of first light emitting devices. The first anode layer is configured to provide a first anode contact 30 to the p-type side of at least some of the light emitting devices in the first light emitting layer 20. For example as shown in FIG. 2, the first anode layer is selectively provided on the mesa surface 29 of every other first mesa structure 28 in order to selectively form first anode contacts 30 to those light emitting devices. The first anode layer 30 is selectively provided on every other light emitting device of the first light emitting layer 20 in order to account for the formation of further light emitting devices between the first light emitting devices of the first light emitting layer having the first anode contacts formed thereon. As such, the first anode layer comprises a plurality of first anode contacts 30 to a selection of the first light emitting devices of the first light emitting layer 20. The first anode contact layer may comprise one or more metallic layers, for example Ti, Al or a Ti and Al metallic stack. The first anode layer may be selectively formed on the mesa surfaces 29 of the first light emitting layer using a suitable patenting method, for example lithography.

Following the formation of the first anode layer, a first gap filling insulating layer 40 may be formed over the first light emitting layer 20 and the first anode contact layer. The first gap filling insulating layer 40 is configured to provide a planar surface over the first light emitting layer 20 thereby filling in any gaps formed due to the first mesa structures 28. The first gap filling insulating layer 40 may comprise any suitable insulator such as $SiO_2$, or $SiN_x$. The gap filling insulating layer 40 may be formed using any suitable deposition method such as chemical vapour deposition (CVD).

Following the formation of the first gap filling insulating layer 40, a first cathode contact layer may be formed to the first n-type semiconducting layer 22 of the first light emitting layer 20. The first cathode contact layer 50 is configured to provide a first cathode contact 50 to the n-type side of each light emitting device in the first light emitting layer 20. As shown in FIG. 2, the first cathode contact layer is formed from the side of the first light emitting layer 20 having the first mesa structures 28 provided thereon such that the first cathode contact layer 50 and the first anode contact layer 30 are provided on the same surface of the first light emitting layer 20.

As shown in FIG. 2, the first cathode contact layer 50 is formed by selectively removing portions of the first light emitting layer 20 in regions between each of the first mesa structures 28. As such, regions of the first light emitting layer 20 (the first n-type semiconducting layer 22) are selectively removed to form first openings in the first n-type semiconducting layer 22 which are (preferably evenly) spaced between the first mesa structures 28 across the first light emitting layer 20. Said first openings may be formed using a suitable selective removal process such as lithography (to define the openings) followed by etching. In the structure shown in FIG. 2, the first openings extend from the exposed surface of the gap-filling insulating layer 40 through to the n-type side of the light emitting layer 20 (i.e. to the first n-type semiconducting layer 22). Following the formation of the first openings, the first cathode contact layer may be formed.

As shown in FIG. 2, the first cathode contact layer is formed within the first openings such that it is in electrical contact with the first n-type semiconducting layer 22 between each first mesa structure 28. Portions of the first cathode contact layer 50 may also be provided over the first gap-filling insulating layer 40 in order to interconnect each of the openings through the first n-type semiconducting layer 22. As such, the first cathode contact layer 50 may provide a common cathode to each of the light emitting devices in the first light emitting layer 20. As shown in FIG. 2, the first cathode contact layer 50 may be configured to encircle each of the light emitting devices within the first light emitting layer 20. The first cathode contact layer may be formed using any suitable technique for the formation of metallic contacts, for example thermal evaporation, or Physical Vapour Deposition. The first cathode contact layer 50 may comprise Ti, Al, or Ni or any other suitable material. In some embodiments, the first cathode contact layer may comprise a plurality of layers, for example a Ni layer and an Al layer. In some embodiments, the first cathode contact layer 50 may have a thickness of at least 100 nm.

In some embodiments, the first cathode contact layer 50 is formed using a single deposition step which fills the first openings entirely. In the structure shown in FIG. 2, the first cathode contact layer is formed with a thickness which is not sufficient to fill the first openings entirely. To improve the conductivity of the cathode contacts, and to avoid any air gaps being formed in the light emitting device precursor, the first opening may be further filled with a first contact infill layer 51. For example, in the method of forming the structure of FIG. 2, the first contact infill layer 51 may be deposited by thermal evaporation, or any other suitable method. The first contact infill layer 51 may comprise any suitable metallic contact material, for example Ti, Al, Au, or Ni. For example, in the structure of FIG. 2 the first contact infill layer 51 may comprise Cu or Au which is deposited using electrodeposition. The first contact infill layer 51 may also act as a heat sink for each first light emitting device of first light emitting layer 20. The first contact infill layer 51 may also help to reduce cross-talk between adjacent light emitting devices. For example, the first contact infill layer may reduce optical cross-talk between a second light emitting device of the second light emitting layer 120 and an adjacent first light emitting device of the first light emitting layer 20.

Following the formation of the first infill contact layer 51, the exposed surface of the first infill contact layer and the first light emitting layer 20 may be subjected to a Chemical Mechanical Polishing (CMP) process. The CMP process may be provided to improve the planarization of the exposed surface for subsequent substrate bonding steps.

It will be appreciated that the structure shown in FIG. 2 is only one possible option for forming an array of first light emitting devices in a first light emitting layer. As such, the present disclosure is not limited to the arrangement of the layers of the first light emitting layer 20 and the anode and cathode contacts shown in FIG. 2.

Following the formation of the electrical contacts to the n-type side of the first light emitting layer 20, a first bonding layer 60 is formed over the first light emitting layer 20 and the first anode contact layer and the first cathode contact layer 50. The first bonding layer provides a bonding surface which covers the first light emitting layer 20, the first anode contact layer and the first cathode contact layer. The first bonding layer 60 is provided in order to form a surface which is compatible with a substrate bonding technique to be used to bond the first light emitting layer 20 to the second light emitting layer 120 (discussed in more detail below).

In the embodiment of FIG. 2, the first bonding layer 60 comprises a dielectric material suitable for forming a direct bond to another bonding layer. For example, in the embodiment of FIG. 2, the first bonding layer comprises $SiO_2$. The first bonding layer 60 is formed over the anode and cathode contacts and the first light emitting layer 20 in order to provide a generally planarised surface extending in a plane which is parallel to the substrate surface 11. The first bonding layer 60 may be formed by any suitable method, for example CVD. In some embodiments, the first bonding layer 60 may comprise an adhesive layer or a polymer layer for bonding the first light emitting layer 20 to the second light emitting layer 120.

It will be appreciated that in the structure of FIG. 2, the gap filling insulating layer 40 and the first bonding layer 60 may both comprise $SiO_2$. As such, in some embodiments where the formation of electrical contacts may follow a different process order, the formation of the gap filling insulating layer 40 may provide a first bonding layer having a first bonding surface 61 suitable for bonding to another bonding layer.

In some embodiments, the first bonding layer 60 may be further subjected to a chemical mechanical polishing process following formation in order to improve the smoothness of the surface. The chemical mechanical polishing process may improve the subsequent bonding of the first bonding layer 60 to the second bonding layer. Thus, a first light emitting layer 20 comprising an array of first light emitting devices may be formed on a first substrate 10 which is suitable for bonding to another light emitting layer.

Figure 3:
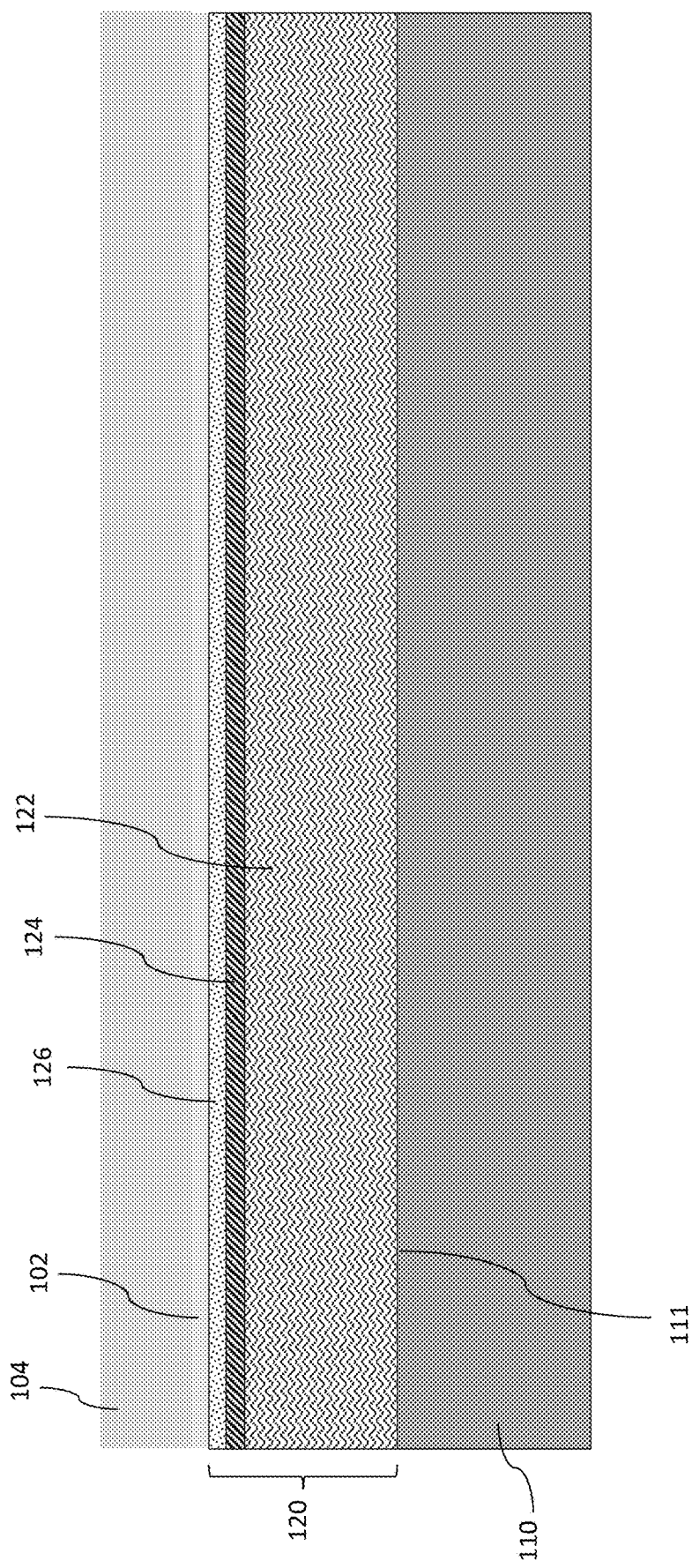
FIG. 3 shows a cross-sectional diagram of a second light emitting layer formed on a second substrate.

In addition to the formation of the first light emitting layer 20 on the first substrate 10, according to the method of the first embodiment, a second light emitting layer 120 is formed on a second substrate 110. An example of such a second light emitting layer 120 formed on a second substrate 110 is shown in FIG. 3.

The second light emitting layer 120 is formed on the second substrate 110 in order to provide a separate (to the first light emitting layer 20) second light emitting layer 120 configured to emit light having a second wavelength different to the first wavelength. The second light emitting layer 120 is formed on a different substrate to the first substrate 10 such that the grown conditions and the substrate can be configured to improve the formation of the second light emitting layer 120. Further, forming the second light emitting layer 120 on the second substrate 110 does not expose the first light emitting layer 20 to the process for forming the second light emitting layer 120.

The second light emitting layer 120 is provided on a second substrate surface 111 of the second substrate 110. The second substrate 110 may be any suitable substrate for fabricating Group-III nitrides thereon. For example, the second substrate 110 may comprise silicon, sapphire, or SiC, or any other suitable substrate for the fabrication of thin film electronics. In particular, the second substrate 110 may include one or more layers which are configured to provide a substrate surface 111 having an in-plane lattice constant configured to reduce strain in the second light emitting layer 120.

The second light emitting layer 120 may comprise a plurality of layers. According to the first embodiment, each layer of the second light emitting layer 120 may comprise a Group-III nitride. The plurality of layers 22, 24, 26 of the second light emitting layer 120 may be formed upon each other in a stack to form the second light emitting layer 120. As such, the plurality of layers of the second light emitting layer 120 may each extend across the second substrate surface 111 as substantially continuous layers. As such, the second light emitting layer 120 may be formed as a substantially continuous layer on the second substrate surface 111.

According to the first embodiment, the second light emitting layer 120 comprises a plurality of Group-III nitride layers such that the second light emitting layer 120 forms a semiconductor junction configured to output light having a second wavelength. As will be discussed further below, the second light emitting layer 120 may be subjected to further processing steps such that it comprises an array of second light emitting devices, wherein each second light emitting device is configured to emit light having the second wavelength. Each second light emitting device of the second light emitting layer 120 may comprise a semiconducting junction, such as a diode, having a p-type side and an n-type side.

As shown in FIG. 3, the second light emitting layer 120 comprises a second n-type semiconducting layer 122, a second active layer 124 and a second p-type semiconducting layer 126.

The second active layer 124 may comprise one or more quantum well layers. As such, the second active layer 124 may be multiple quantum well layer. The quantum well layers within the second active layer 124 may comprise a Group-III nitride semiconductor preferably a Group-III nitride alloy including In. For example, in the arrangement shown in FIG. 3, the second active layer 124 may comprise alternating layers of GaN and $In_ZGa_{1-Z}N$, where $0<Z\leq1$. In particular, in some embodiments the second active layer 124 may comprise $In_ZGa_{1-Z}N$ layers where $0.2<Z\leq0.5$. As such, the second active layer 124 of the second light emitting layer 120 may be configured to generate light having a wavelength of at least 490 nm, and no greater than 670 nm. The thickness and In-content (Z) of the quantum well layer may be controlled in order to control the wavelength of light generated by the second active layer 124. The second active layer 124 may be formed as a continuous layer covering a substantial portion (e.g. all) of the surface of the second n-type semiconducting layer 122.

It will appreciated that in the method of the first embodiment, the indium content (Z) of the second active layer 124 may be higher than indium content (Y) of the first active layer 24 (i.e. Z>Y). The second active layer 124 may be formed on a suitable second substrate 110 having an in-plane lattice constant on the substrate surface 111 which is configured to reduce or eliminate strain in the second active layer 124 resulting from an increased in-plane lattice constant due to the indium content (Z) of the second active layer 124.

The second active layer 124 may be deposited using any suitable process for the fabrication of Group-III nitride thin films, for example metal organic chemical vapour deposition (MOCVD), or molecular beam epitaxy (MBE).

The second n-type semiconducting layer 122 may be formed as a substantially continuous layer across the second substrate surface 111. As shown in FIG. 3, the second active layer 124 is formed on the second n-type semiconducting layer 122. According to the first embodiment, the second n-type semiconducting 122 layer may comprise GaN. As such, the second n-type semiconducting layer 122 may be formed in a similar manner to the first n-type semiconducting layer 22.

As shown in FIG. 3, the second n-type semiconducting layer 124 may be formed on the second substrate surface 111 with a thickness in the normal direction to the substrate surface 111 which is thicker than the thickness required to provide suitable functionality for the light emitting layer 120. For example as shown in FIG. 3, the second n-type semiconducting layer 122 may be formed with a thickness of at least 0.8 µm. In some embodiments, the second n-type semiconducting layer may be formed with a thickness of at least: 1 µm, 1.2 µm, 1.5 µm, 2 µm, or 3 µm. Such a thickness may be provided to assist with the removal of the second substrate 110 in a subsequent processing step.

As shown in FIG. 3, the second p-type semiconducting layer 126 is provided over the second active layer 124. As such, the second p-type semiconducting layer 126 is provided on a side of the second active layer 124 opposite the side of the second active layer 124 on which the second n-type semiconducting layer 122 is provided. According to the first embodiment, the second p-type semiconducting layer 126 comprises a Group-III nitride, for example GaN. As such, the second p-type semiconducting layer 126 may be formed in a similar manner to the first p-type semiconducting layer 26.

Following the formation of the second light emitting layer 120, a second bonding layer 102 may be formed over the second light emitting layer 120. The second bonding layer 102 is configured to provide a second bonding surface 103 for bonding the second light emitting layer 120 and the second substrate 110 to a handling substrate 104. The second bonding layer 102 may comprise any suitable material for the bonding of substrates, For example, according to the first embodiment the second bonding layer 102 comprises a dielectric material such as SiO$_2$. The second bonding layer 102 may be formed over the second light emitting layer 120 as a substantially continuous layer using any suitable process, for example CVD. As such, the second bonding layer 102 may be formed in a similar manner to the first bonding layer 60. The second bonding layer 102 may also be subjected to a CMP process, similar to the first bonding layer 60.

As shown in FIG. 3, the second substrate 110 and the second light emitting layer 120 are bonded to the handling substrate 104 by the second bonding layer 102. The handling substrate 102 is configured to provide a substrate for transferring the second light emitting layer 120 from the second substrate 110 on which it is formed to the first bonding layer 60. As such, the handling substrate 102 may be any suitable substrate for handling semiconductor devices. For example, the handling substrate 102 may comprise silicon or any other suitable substrate. The handling substrate 104 may provide a handling surface 105 for bonding to the second bonding surface 103 of the second bonding layer 102.

According to the first embodiment whereby the second bonding layer 102 comprises a dielectric material configured to form a direct bond, the handling substrate may provide a handling surface 105 which is configured to form a direct bond with the second bonding surface 103 of the second bonding layer 102. For example, the handling substrate 104 may comprise a layer of SiO$_2$ (not shown). The handling substrate 104 may be bonded to the second bonding layer 102 using any suitable means for bonding to substrates.

According to the first embodiment, the handling substrate 104 is bonded to the second bonding layer 102 using a direct bond through the application of pressure and heat in a wafer bonder.

The wafer bonder enables the handling substrate surface 105 to be arranged parallel to the second bonding surface 103. The wafer bonder is then configured to bring the two surfaces into contact whereby the second bonding layer 102 forms a bond with the handling substrate surface 205 of the handling substrate 104. In some embodiments, the wafer bonder may apply one or more of heat and pressure to improve the bond formed between the handling substrate surface 105 and the second bonding surface 103.

For example, in some embodiments, the wafer bonder may apply a compressive force of at least 10 kN for bonding the handling substrate 104 to the second light emitting layer 120 (via the second bonding layer 102). In some embodiments, the wafer bonder may apply a compressive force of at least 20 kN, 30 kN, or 40 kN. By applying a larger compressive force, the reliability of forming the bond between substrates may be improved. In some embodiments, the wafer bonder may apply a compressive force of no greater than 45 kN in order to reduce the risk of substrate fracture or other undesirable deformation of the substrates during bonding.

In some embodiments, the wafer bonder may also be configured to heat the handling substrate 104 and/or the second light emitting layer/second bonding layer 102. For example, the wafer bonder may be configured to heat the handling substrate 104 and/or the second light emitting layer/second bonding layer 102 to a temperature of at least 100° C. In some embodiments, the wafer bonder may be configured to heat the handling substrate 104 and/or the second light emitting layer/second bonding layer 102 to a temperature of at least: 200° C., 300° C., 400° C., or 500° C. The wafer bonder may be configured to hold the second substrate 104 and second light emitting layer 120 under compression, and optionally at temperature for a time period. In some embodiments, the time period may be at least: 1 minute, 2 minutes, 5 minutes, 10 minutes or 1 hour.

Accordingly, a wafer bonder may be used to improve the formation of direct, fusion bonds at the interface between the handling substrate 104 and the second bonding layer 102.

Although the first embodiment utilises direct bonds formed between dielectric layers, in other embodiments other methods for bonding a substrate (such as handling substrate 102) to a light emitting layer may be used. For example, methods according to this disclosure may utilise tap bonding, polymer bonding, or oxide bonding.

For example, in some embodiments a polymer bond may be used to bond substrates. Thus, the handling substrate 104 may also be bonded to the second bonding layer 102 using a polymer bond (i.e. an adhesive bond). Such a process involves the application of an adhesive layer (e.g. a polymer layer) to the handling substrate 104 and/or the second light emitting layer 120. The adhesive layer may be applied by spin coating. The two substrates may then be brought into contact via the adhesive layer(s). Pressure and/or heat may then be applied to the substrates to cure the adhesive bond. Examples of suitable polymers for an adhesive bonding process include polyimides, methylsilesquioxane (MSSQ), polyetherketone (PEEK), thermosetting copolyesters (ASTD), thermoplastic copoloymers (PVDC), parlyene, liquid crystal polymers, and waxes. Polymer bonding may provide a substrate bond which may be easily removed through application of a suitably selective solvent. As such, polymer bonding may be particularly well suited for bonding applications which are temporary in nature, such as the bonding of a substrate to a handling substrate 104. Further information on substrate bonding techniques such as oxide bonding, tap bonding, and polymer bonding may be found in at least "MEMS Materials and Processes Handbook", Ch. 11m Ghodssi R., et al, Springer Science+Business Media, LLC 2011.

Once the second light emitting layer 120 is bonded to the handling substrate 104 via the second bonding layer 102, the second substrate 110 is removed from the second light emitting layer 120. A diagram of such a structure in shown in FIG. 4.

The second substrate 110 may be removed from the second light emitting layer 120 using any suitable process. For example, the second substrate 110 may be removed using a grinding process (i.e. an abrasive process). The grinding process may be provided to remove a substantial portion of the second substrate 110, or all of the second substrate 110. Where some of the second substrate 110 remains following the grinding process (e.g. less than 5 µm thickness), an etching process may be provided to remove the remaining portion of the second substrate 102. The etching process may selectively remove the second substrate 110, leaving behind the second light emitting layer 120 bonded to the handling substrate 104.

Figure 4:
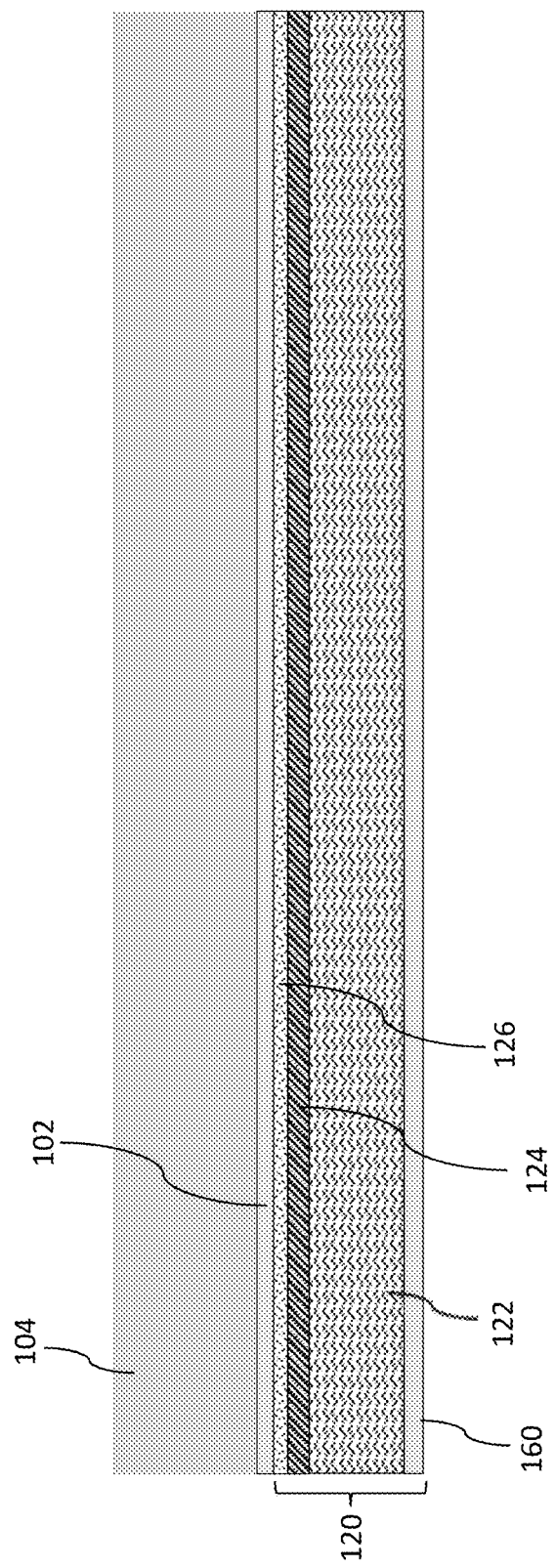
FIG. 4 shows a cross-sectional diagram of a second light emitting layer with the second substrate removed.

Following the removal of the second substrate 110, a first major surface 121 of the second light emitting layer 120 is exposed. The first major surface 121 of the second light emitting layer 120 is on an opposite side of the second light emitting layer 120 to the handling substrate 104. As discussed above, the second light emitting layer 120 may be formed with a thickness in the direction normal to the handling substrate surface 106 which is greater than the desired thickness for the second light emitting layer 120. Following the removal of the second substrate 110, the second light emitting layer 120 may be etched from the first major surface 121 in order to reduce the thickness of the second light emitting layer 120 down to its desired size. For example, as shown in FIG. 4, the second n-type semiconducting layer 122 has been etched such that its thickness in the direction normal to the handling substrate surface 105 is reduced from its as-deposited thickness. In some embodiments, the thickness of the second n-type semiconducting layer 122 may be etched such that its thickness is no greater than 2 µm, or more preferably 1.5 µm. By removing part of the second n-type semiconducting layer 122 to which the second substrate 110 was previously bonded, defects in the second n-type semiconducting layer resulting from the removal of the second substrate 110 may also be removed. In some embodiments, the thickness of the second n-type semiconducting layer 122 may be etched such that its thickness is at least 0.8 µm. Such a thickness may reduce contact resistance on the n-type side of the second light emitting device layer 120.

Following the (optional) etching process to reduce the thickness of the second light emitting layer 120, a third bonding layer 160 is formed over the first major surface 121 of the second light emitting layer 120. The third bonding layer 160 is configured to provide a layer for bonding the second light emitting layer 120 to the first light emitting layer 20 via the first bonding layer 60. According to the first embodiment, the third bonding layer 160 comprises a dielectric material such as SiO$_2$. The third bonding layer 160 is thus configured to form a direct, fusion bond with the first bonding layer 60 in order to bond the first light emitting layer 20 to the second light emitting layer 120. In other embodiments of the disclosure, other bonding methods may be used to bond the first and second light emitting layers 20, 120 together. For example, tap bonding, polymer bonding, or oxide bonding may be used.

As such, in some embodiments, the third bonding layer 160 may comprise an adhesive layer for bonding to the first bonding layer 60. The adhesive layer may be provided as an alternative to forming the third bonding layer 160 from a dielectric material, or the adhesive layer may be provided in addition to the dielectric material.

Figure 5:
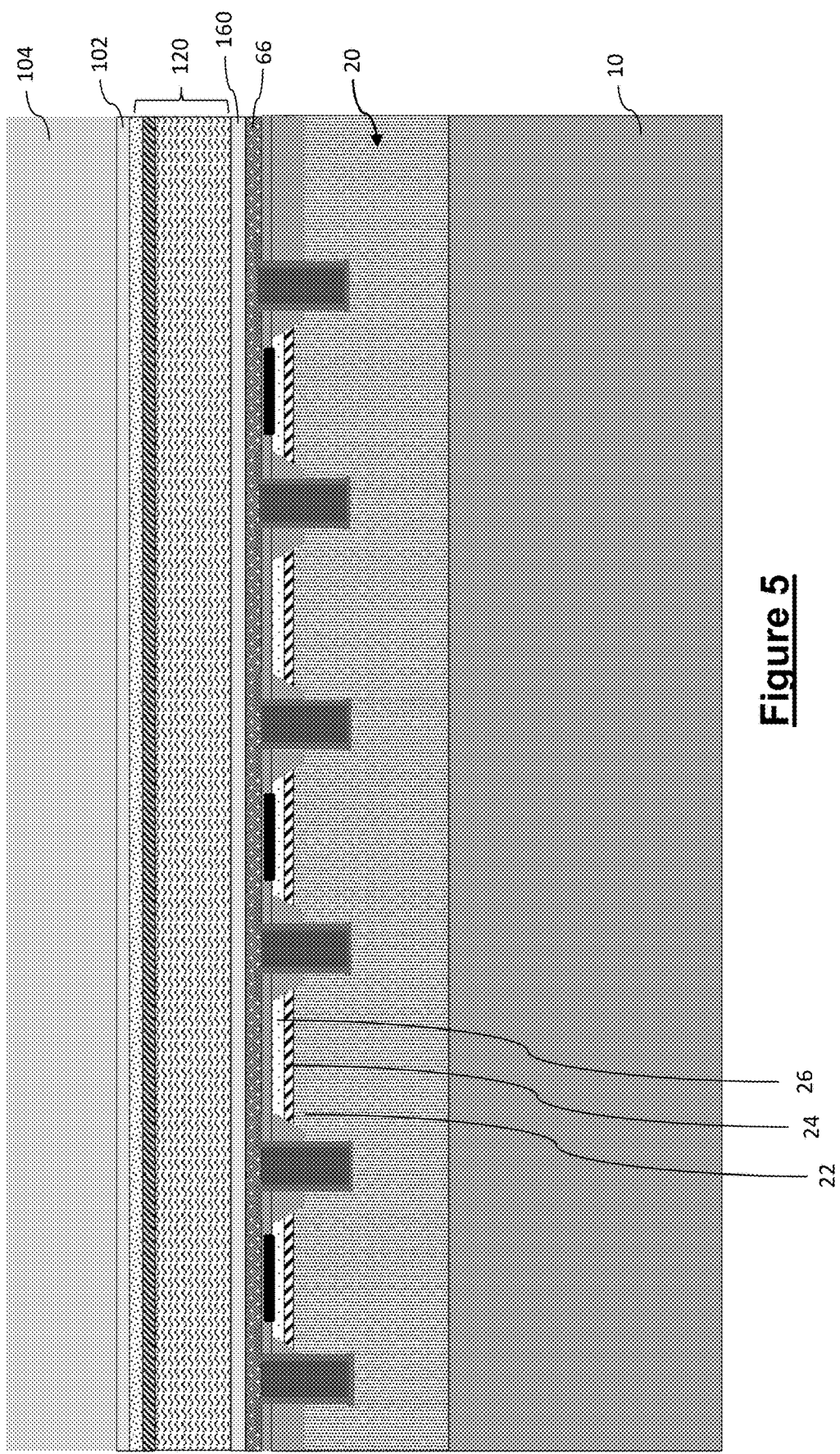
FIG. 5 shows a cross-sectional diagram of the second light emitting layer bonded to the first light emitting layer via the first and second bonding layers.

An example of the first and second light emitting layers 20, 120 bonded together is shown in FIG. 5. The first and second light emitting layers 20, 120 may be bonded together using a wafer bonder, similar to the process for bonding the second light emitting layer to the handling substrate 102. Importantly, the second light emitting layer 120 does not include any light emitting device features at this stage of the method. Thus, the bonding process does not require precise mechanical alignment of the second light emitting layer 120 with the light emitting device features of the first light emitting layer 20. Rather, the bonding of the second light emitting layer 120 may be performed without the need for alignment of features in the second light emitting layer 120.

Following the bonding of the first and the second light emitting layers 20, 120 the handling substrate 102 may be removed from the second light emitting layer 120. The process for removing the handling substrate 104 from the second light emitting layer 120 will depend on the bonding method used for bonding the handling substrate to the second light emitting layer 120. In the method according to the first embodiment, the handling substrate 104 is removed from the second light emitting layer 120 by selectively etching the second bonding layer 102 (i.e. whilst not etching the second light emitting layer 120). As such, the selective etching process etches the second bonding layer 102 to separate the second light emitting layer 120 from the handling substrate 104.

For embodiments of the disclosure where polymer bonding is used to bond a handling substrate 104 to the second light emitting layer 120, the handling substrate may be removed by submerging the substrates in a selective solvent to remove the polymer. In other embodiments, the polymer may be removed by UV-assisted wet etching.

Figure 6:
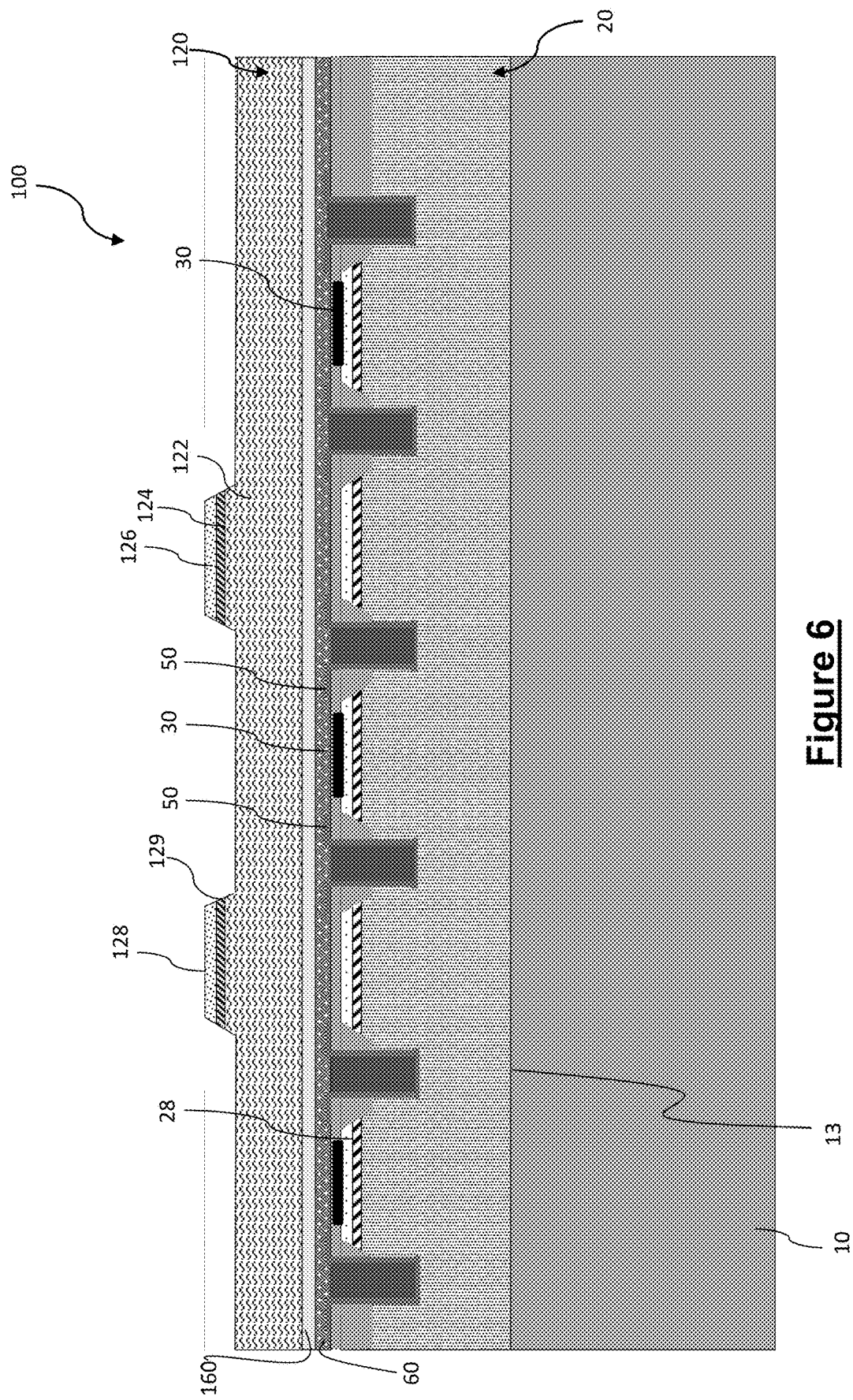
FIG. 6 shows a cross-sectional diagram of the formation of second mesa structures in the second light emitting layer.

Following the removal of the handling substrate 104, an array of second light emitting devices are formed from the second light emitting layer 120. As shown in FIG. 6, forming the array of second light emitting devices comprises forming a second mesa structure 128 for each light emitting device within the second light emitting layer 120. As shown in FIG. 6, the second mesa structures 128 each extend in a direction normal to the first substrate surface 11. Each second mesa structure 128 comprises a stack of Group III-nitride layers from the second light emitting layer 120. As shown in FIG. 6, the second mesa structure comprises a stack of Group III-nitride layers including a portion of the second n-type semiconducting layer 122, a portion of the second active layer 124, and a portion of the second p-type semiconducting layer 126. As shown in FIG. 6, each second mesa structure 128 has a generally trapezoidal cross-section in a plane normal to the first substrate surface 11. As such, each second mesa structure 128 comprises a generally planar second mesa surface 127 which is aligned with the surface of the first substrate 10. Each second mesa structure 128 also comprises second sidewall surfaces 129 which surround the second mesa surface 27. Each of the plurality of Group III-nitride layers forming a second mesa structure 128 extend as substantially continuous layers across the second mesa structure 128 between the second sidewall surfaces 129. The second sidewall surface 129 of each second mesa structure 128 extend in a direction generally transverse to the substrate surface 11. In the embodiment shown in FIG.

6, the second sidewall surfaces 129 are inclined relative to the substrate surface 11 such that the inclined second sidewall surfaces 129 define the trapezoidal cross section.

As shown in FIG. 6, the second mesa structures 128 are spaced apart across the second light emitting layer 120 in order to form a regular spaced array of light emitting devices. The spacing of the second mesa structures 128 may be different to the spacing of the first mesa structures 28 in the first light emitting layer 20. As such, the array of second light emitting devices may be aligned relative to the array of the first light emitting devices such that the first and second light emitting devices forming part of the light emitting device array precursor are laterally offset from each other in a plane parallel the first and second light emitting layers (e.g. a plane parallel to the first substrate surface 11). The lateral spacing between each of the first and second light emitting devices allows each of the first and second light emitting devices to be observed by user. In addition to the lateral spacing between the first and second light emitting device, it will be appreciated that the first light emitting devices are inherently spaced apart from the second light emitting devices in a plane normal to first and second light emitting layers 20, 120 due to the layered construction of the light emitting device array precursor.

It will be appreciated in FIG. 6 that the second mesa structures 128 overlap with unused first mesa structures 128 of the first light emitting layer. Of course, in other embodiments, the unused first mesa structures may not be formed when forming the array of first light emitting devices. As such, in some embodiments, the arrays of first and second light emitting devices may be formed in the respective light emitting layers 20, 120 with a pitch which is greater than the pitch between adjacent light emitting devices in the resulting image plane.

The second mesa structures 128 may be formed using a selective removal process similar to the process described for forming the first light emitting devices. By forming the second light emitting devices in the second light emitting layer 120 after the second light emitting layer 120 is bonded to the first light emitting layer 20, the method according to the first embodiment avoids having to precisely align light emitting device features of the second light emitting layer with light emitting device features of the first light emitting layer 120 for the substrate bonding step. Precise mechanical alignment of two substrates for substrate bonding is technically challenging to perform at the same level of accuracy as the alignment of patterning layers such as lithographic steps.

It will be appreciated that the embodiment shown in FIG. 6 is only one possible option for forming an array of second light emitting devices in the second light emitting layer 120. As such, the present disclosure is not limited to the arrangement of the layers of the second light emitting layer 120, nor the arrangement of the second light emitting devices shown in FIG. 6.

Accordingly, a light emitting device array precursor 100 according to a first embodiment of the disclosure may be provided. Although the method according to the first embodiment involves the formation of first anode contacts 30 and a first cathode contact layer 50 to the first light emitting devices prior to the bonding of the second light emitting layer 120, it will be appreciated that the present disclosure is not limited to such a processing order. For example, the skilled person will appreciate that it is possible to form electrical contacts through to the first light emitting layer 20 following the bonding of the second light emitting layer 120 by way of suitable lithographic and etching steps (e.g. etching through the second light emitting layer 120 to the first light emitting layer 20).

According to the first embodiment, the light emitting device array precursor may also be subjected to further processing steps.

For example, following the formation of the array of second mesa structures 128, a second anode layer may be formed on the array of second light emitting devices. The second anode layer is configured to provide a second anode contact 130 to the p-type side of at least some of the light emitting devices in the second light emitting layer 120. For example, as shown in FIG. 6, the second anode layer is selectively provided on the mesa surface 129 of each of the second mesa structures 128 in order to selectively form second anode contacts 130 to those light emitting devices.

It will be appreciated, that in the example shown in FIG. 6 a different mask pattern is used to form the second light emitting devices in a second light emitting layer 120, compared to the mask pattern used to form the first light emitting devices in the first light emitting layer 20. In other embodiments, the same mask pattern may be used to form the mesa structures of the first and second light emitting layer 20, 120, wherein selective patterning of the second anode contacts 130 could be used to selectively form second light emitting devices in the second light emitting layer 120 which are offset in the transverse direction from the first light emitting devices of the first light emitting layer 20.

As such, the first anode contacts 30 and the second anode contacts 130 may be selectively formed in order to provide an array of first and second light emitting devices of the light emitting device array precursor, which are spaced apart from each other in a plane parallel to the first substrate surface 11. The second anode contacts 130 may be formed in a similar manner to the first anode contacts 30 discussed above.

Following the formation of the second anode layer, unused portions of the second light emitting layer 120 may be selectively removed, for example using an etching process. The selective removal process may etch through the thickness of the second light emitting layer 120 in a direction normal to the first substrate surface 11 in order to separate each second light emitting device of the second light emitting layer from the other light emitting devices. Such a separation step may be performed in view of the subsequent formation of electrical contacts to each of the light emitting layers 20, 120 from a top surface of the light emitting device array precursor.

The selective removal of unused portions of the second light emitting layer 120 may selectively remove portions of the second light emitting layer which are aligned with each of the first light emitting devices of the first light emitting layer 20. Thus, it will be appreciated that in some embodiments the same pitch mask pattern may be used to form the first and second mesa structures 28, 128, wherein the selective removal step removes the unused second mesa structures 128 from the second light emitting layer 128. An example of the selective removal of unused portions of the second light emitting layer (i.e. not forming a second light emitting device) is shown in FIG. 7.

Following the selective removal step, a second gap filling insulating layer 140 may be formed over the second light emitting layer 120 and the second anode contact layer. The second gap filling insulating layer 140 is configured to provide a planar surface over the second light emitting layer 120, thereby filling in any gaps formed due to the formation of the second mesa structures 128 and the subsequent selective removal of unused portions of the second light emitting layer 120. The second gap filling insulating layer 140 may be formed in a similar manner to the first gap filling insulating layer 40.

The second cathode contact layer 150 may be formed on the second light emitting layer 120. The second cathode contact layer 150 is configured to provide an electrical contact to the n-type side of each light emitting device in the second light emitting layer 120. The second cathode contact layer 150 is also configured to electrically connect the n-type sidewall each light emitting device in the second light emitting layer 120 to the first cathode contact layer 50 of the first light emitting layer 20. As such, the first cathode contact layer 50 and the second cathode contact layer 150 may be electrically connected together in order to form a common cathode for the light emitting device array precursor.

Figure 7:
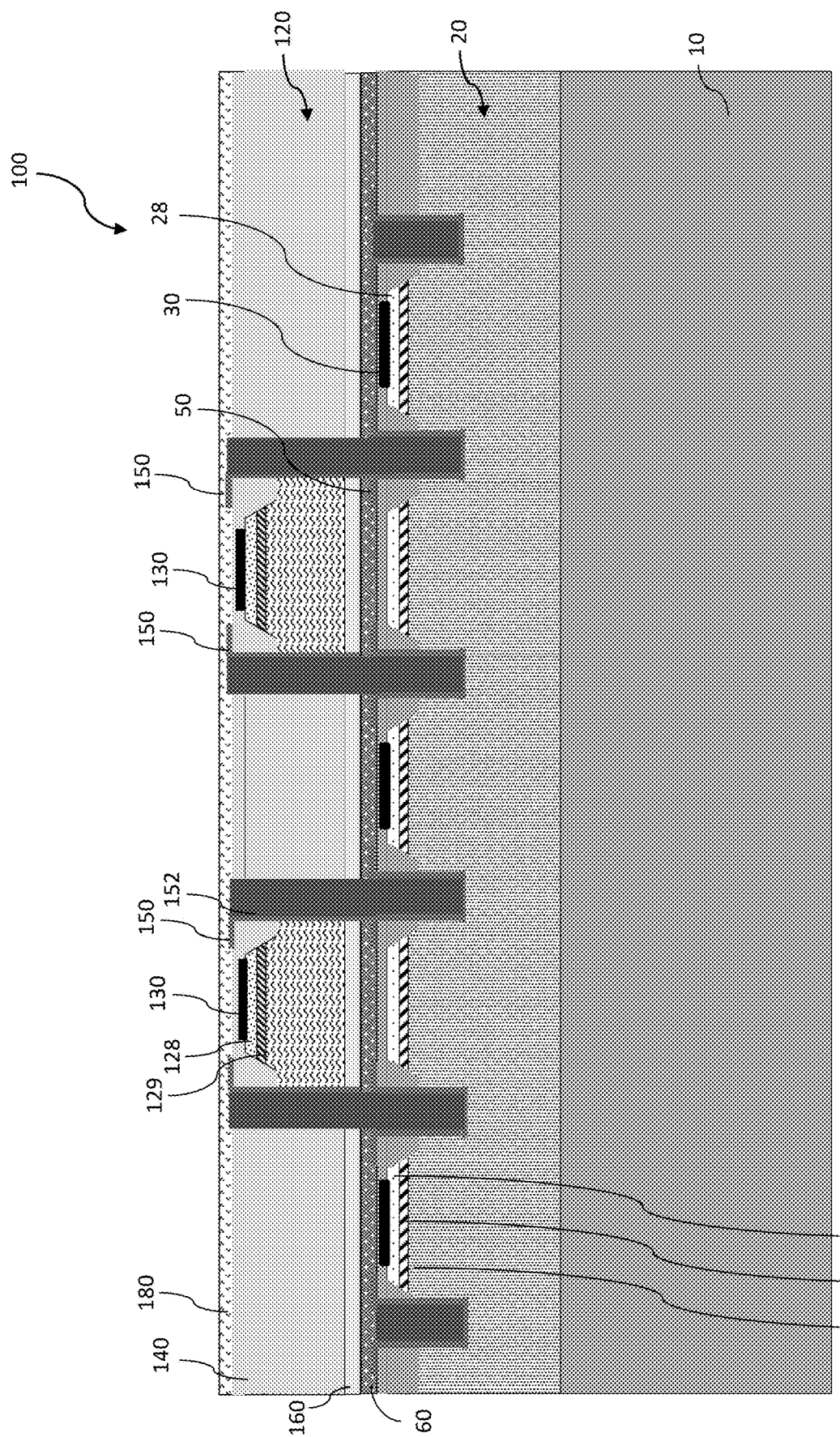
FIG. 7 shows a cross-sectional diagram of the formation of second anode contacts to the second light emitting layer and the first anode contacts.

An example of a second cathode contact layer 150 is shown in FIG. 7. As shown in FIG. 7, the second cathode contact layer 150 is formed by selectively removing portions of the second light emitting layer 120 in regions between each of the second mesa structures 128. As such, regions of the second light emitting layer 120 (the second n-type semiconducting array 122) are selectively removed in order to form openings in the second n-type semiconducting layer 122. The openings are generally aligned with the openings formed in the first n-type semiconducting layer 22 which were formed previously to accommodate the first cathode contact layer 50. The second openings may be formed using a similar selective removal process such as used to form the first openings for the first cathode contact layer 50.

As shown in FIG. 7, the second cathode contact layer 150 is formed in the second openings such that it is in electrical contact with the second n-type semiconducting layer 122 between each first mesa structure 28. Portions of the second cathode contact layer 150 may also be provided over the second gap filling insulating layer 140 in order to interconnect each of the openings through the second n-type semiconducting layer 122.

The second cathode contact layer 150 may be formed in a similar manner to the first cathode contact layer discussed above. For example, as shown in FIG. 7, the second openings are also filled with a second infill contact layer 151 in a manner similar to the first infill contact layer 51 for the first light emitting layer 20.

It will be appreciated that the structure shown in FIG. 7 is only one possible option for forming second cathode contacts and second anode contacts 130 to the second light emitting layer 120. As such, the present disclosure is not limited to the relative arrangement of the layers of the first and second light emitting layers 20, 120 and the anode and cathode contact layers shown in FIG. 7.

Accordingly, a light emitting device array precursor 100 comprising electrical contacts may be provided. The light emitting device array precursor 100 comprises first and second light emitting layers 20, 120 which are configured to emit different wavelengths of light. The first and second light emitting layers 20, 120 provide an array of first and second light emitting devices configured to emit light of the first or second wavelength respectively. The light emitting devices may be arranged in the first and second light emitting layers 20, 120 such that the first and second light emitting devices are spaced apart relative to each other in a plane parallel to the first substrate surface 11.

Following the formation of the electrical contacts to the n-type side of the second light emitting layer 120, the light emitting device array precursor 100 may, in some embodiments, be subjected to further processing steps in order to make the light emitting device array precursor suitable for bonding to a back plane electronics substrate. For example, a planarising dielectric layer 180 may be formed over the second light emitting layer 120 and the second gap filling insulating layer 140 to cover the anode contacts 130 and the second cathode contact layer 150. The planarising dielectric layer 180 may provide a planarised dielectric surface 181 to which the back plane electronics substrate 190 is bonded. The planarising dielectric layer 180 may comprise a suitable dielectric material for example $SiO_2$. First and second electrical contacts may also be formed through the planarising dielectric layer 180, the first and third bonding layers 60, 160, and the gap-filling insulating layers 40, 140 to provide an electrical contact between the planarised dielectric surface and the respective first and second anode contacts 30,130 of each of the light emitting devices. The formation of electrical vias is well known to the person skilled in the art.

Figure 8:
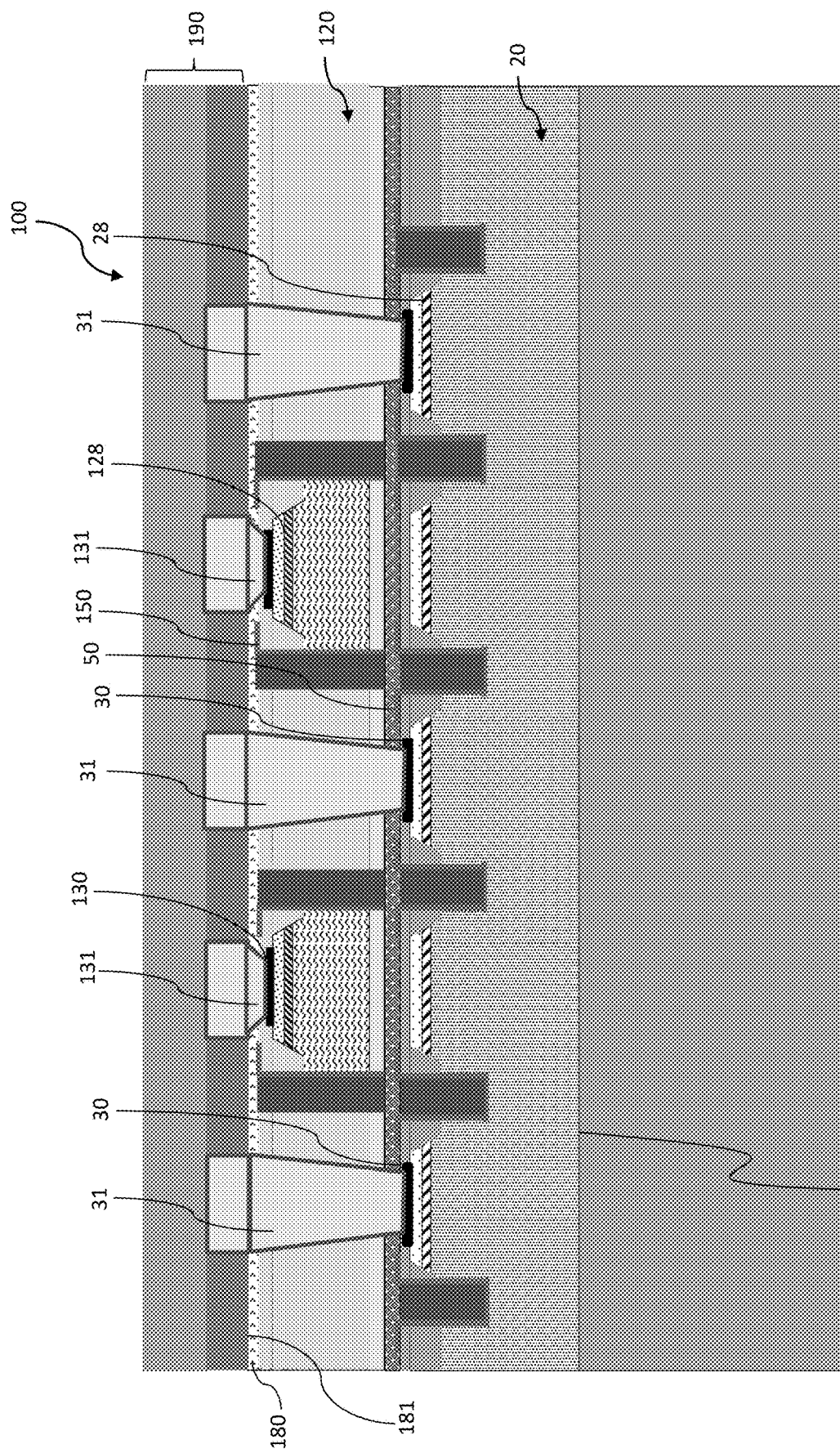
FIG. 8 shows a cross-sectional diagram of the formation of metallic contacts to each light emitting device and the bonding of the light emitting device array precursor to a back plane electronics substrate.

Following the formation of the planarised dielectric surface 101 and first and second electrical contact vias 31,131, the light emitting device array precursor may be bonded to a back plane electronics substrate 190. An example of such a structure is shown in FIG. 8. As shown in FIG. 8, a back plane electronics substrate 190 is bonded to the light emitting device array precursor. The back plane electronics substrate 190 has a plurality of electrical contacts which are aligned with the first and second electrical vias 30, 131. As such, the back plane electronics substrate 190 is configured to provide electronic driving circuitry for the light emitting devices of the light emitting device array precursor. Various methods for bonding electrical devices, such as an array of light emitting devices, to a backplane electronics substrate are known to the skilled person, and so are not further discussed herein.

In some embodiments, the light emitting device array precursor may also be subjected to further processing steps such as removal of the first substrate 10 in order to expose a light emitting surface 13 of the light emitting device array precursor 100.

Figure 9:
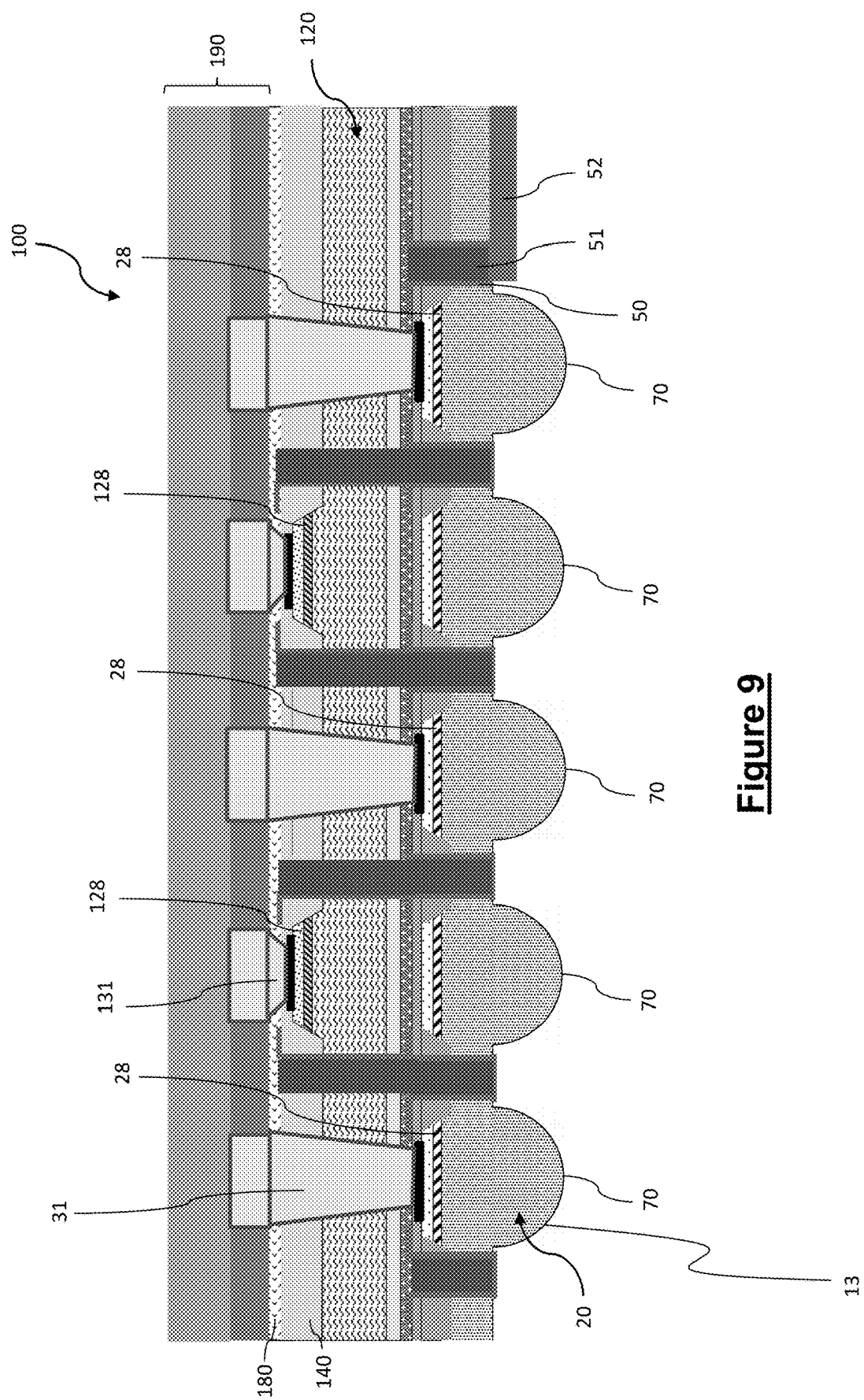
FIG. 9 shows a cross-sectional diagram of the further processing of the light emitting surface of the light emitting array precursor to form light extraction features for each light emitting device of the light emitting device array precursor.

The first substrate 10 may be removed from the first light emitting layer 20 using a similar substrate removal process as discussed above previously in relation to the removal of the second substrate 110 from the second light emitting layer 120. FIG. 9 shows an example of a light emitting device array precursor 100 wherein the first substrate 10 is removed to expose the light emitting surface 13. As shown in FIG. 9, the light emitting surface 13 is provided by the exposed major surface of the first light emitting layer 20.

Further, in some embodiments of the disclosure for example as shown in FIG. 9, a light emitting surface 13 of the light emitting device array precursor 100 may be subjected to further processing steps in order to add light extraction features 70 to the light emitting surface 13. For example, as shown in FIG. 9, portions of the first light emitting layer 20 have been selectively removed in order to form a light extraction feature 70 for each of the light emitting devices of the light emitting device array precursor 100. Each light extraction feature 70 is configured to increase the light extraction efficiency of the respective light emitting device with which it is aligned. In the example shown in FIG. 9, forming each light extraction feature 70 comprises shaping the first emitting layer 20 to define a lens-shaped portion on a light emitting surface of the first light emitting layer 20. As such, the light emitting surface 13 of the first light emitting layer 20 is shaped to include a convex portion aligned with each light emitting device. The light extraction features 70 such as the convex portions are configured to improve light extraction efficiency by reducing the occurrence of total internal reflection at the interface between the first light emitting layer 20 and the surroundings. In the embodiment of FIG. 9, the convex portions of the light emitting surface 13 are shaped by etching the first n-type semiconducting layer 22 of the first light emitting layer 20 to form the desired light emitting surface profile.

Various methods for forming light extraction features are known to the skilled person. Accordingly, the convex shaped light extraction feature 70 are only one example of possible light extraction features that may be formed. Other light extraction features that could be added to the light emitting array precursor 100 of FIG. 9 include an anti-reflection layer, one or more band stop filters, and/or other collimating light extraction features.

As shown in FIG. 9 a further common cathode contact 52 is provided on the light extraction surface to provide a contact point to which a further electrical connection may be made. The cathode contact 52 is in electrical contact with each of the first cathode contacts 50 and each of the second cathode contacts 150.

Accordingly, as set out in the description above, the light emitting device array precursor 100 may be subjected to further processing steps in order to provide a light emitting device array which is configured to emit light of a first and second wavelength. The light emitting device array may be used to form a display, or a projector.

Thus, in accordance with the description above, a light emitting device array precursor 100 is provided. The light emitting device array precursor 100 comprises a first light emitting layer 20, a first bonding layer 60, a third bonding layer 160, and a second light emitting layer 120. The first light emitting layer 20 comprises an array of first light emitting devices. Each first light emitting device is configured to admit light having a first wavelength. The second light emitting layer 120 comprises an array of second light emitting devices. Each second light emitting device is configured to admit light having a second wavelength different to the first wavelength. The array of the second light emitting devices is aligned with the array of first light emitting devices. For example, in some embodiments the first and second wavelengths may be configured to emit at least two of blue, red, or green visible light.

A further example of a light emitting device array precursor (a light emitting device array) according to an embodiment of this disclosure is shown in FIG. 9. As shown in FIG. 9, the first light emitting layer 120 has a first boding layer 60 provided on the first light emitting layer 120. A third bonding layer 160 is bonded to the first bonding layer 60. The second light emitting layer 120 is then provided on the second bonding layer 160. As shown in the embodiment of FIG. 9, the light emitting device array precursor also includes first and second anode contacts 31, 131, and first and second cathode contacts 50,150.

Next, according to a second embodiment of the disclosure, a light emitting device array precursor comprising a plurality of light emitting devices configured to emit light having either a first, second or third wavelength will be described.

The method for forming the second embodiment of the disclosure utilizes similar substrate boding techniques as the first embodiment in order to combine first, second and third light emitting device layers 20, 120, 220 which were each fabricated on a respective first, second and third substrate 10, 110, 210 into a single light emitting device array precursor 200.

Figure 10:
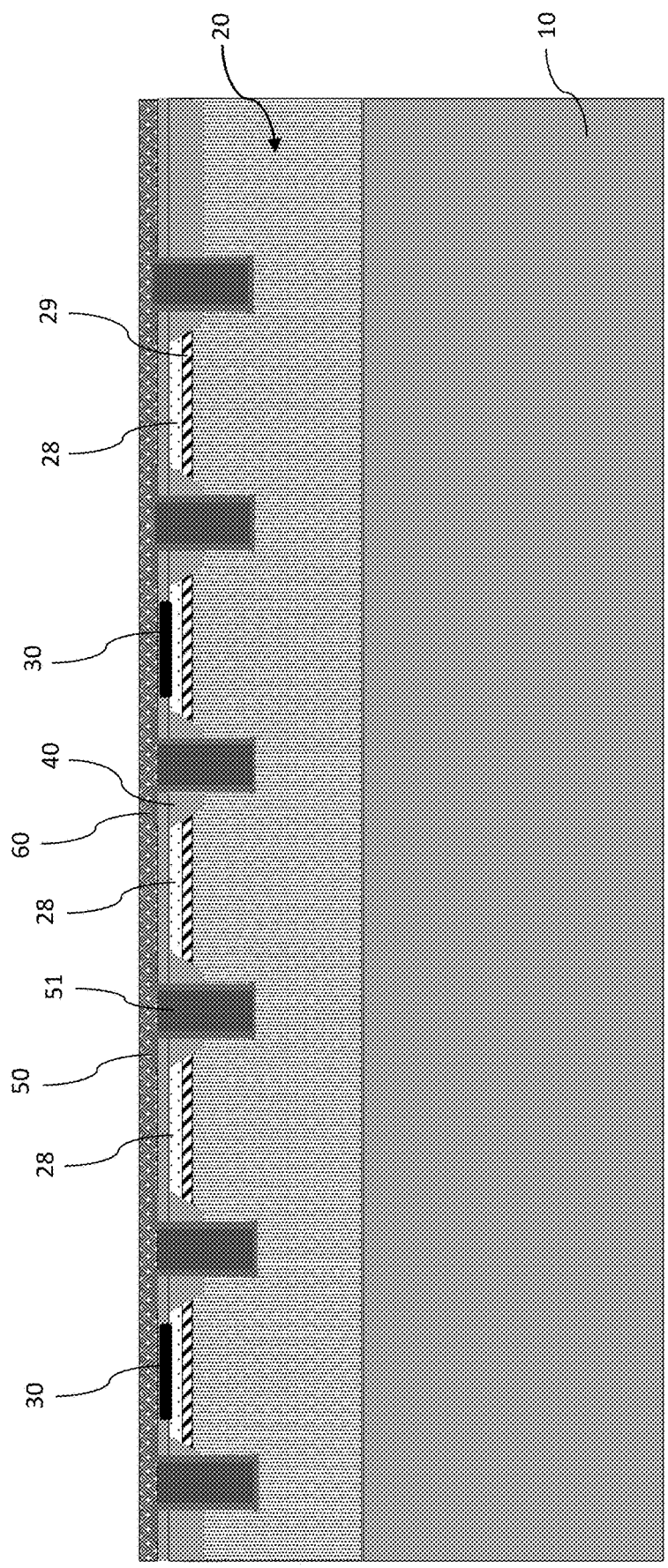
FIG. 10 shows a cross-sectional diagram of a first light emitting layer according to another embodiment of the disclosure.

Thus, similar to the first embodiment, a method of forming the light emitting device array precursor 200 according to the second embodiment may comprise forming a first light emitting layer 20 on a first substrate 10. An example of such a first light emitting layer 20 is shown in FIG. 10. It will be appreciated that the arrangement of the layers shown in the first light emitting layer in FIG. 10 is similar to that of the first embodiment. Accordingly, a similar method may be used to form the first light emitting layer 20 of the second embodiment.

Figure 11:
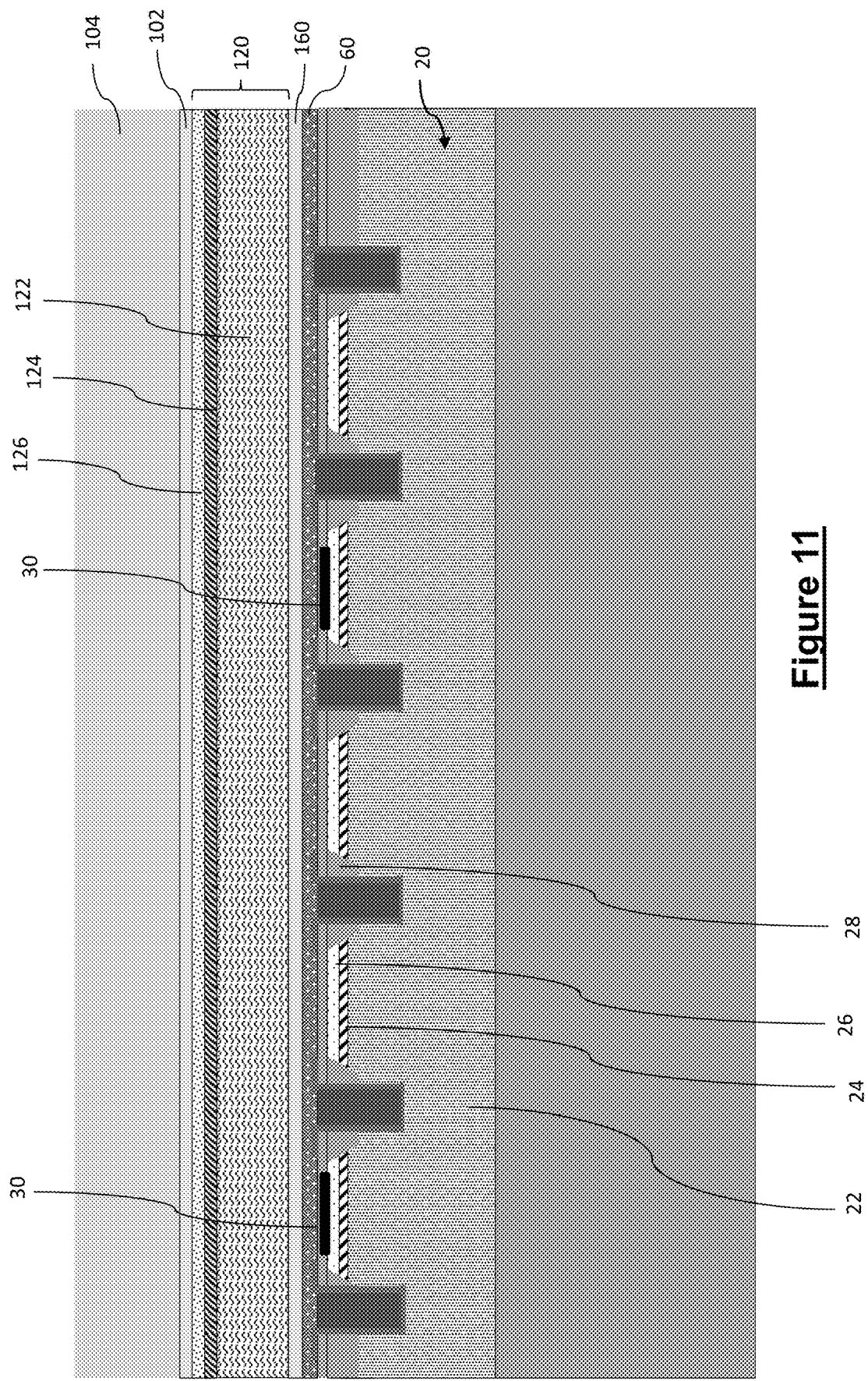
FIG. 11 shows a cross-sectional diagram of a first light emitting layer bonded to a second light emitting layer according to another embodiment of the disclosure.

Similarly, a second light emitting layer 120 may be formed on a second substrate 110. The second light emitting layer 120 may be formed on the second substrate in a similar manner to the process described above in relation to the first embodiment. Following the formation of the second light emitting layer 120, the second light emitting layer 120 may be bonded to a handling substrate 104 by means of a second bonding layer 102. The second substrate 110 may then be removed from the second light emitting layer 120. As such, the process of transferring the second light emitting layer 120 from the second substrate 110 to the handling substrate 104 may be similar to the process described above in relation to the first embodiment. The second light emitting layer 120 may then be bonded to the first light emitting layer by forming a third bonding layer 160 on the second light emitting layer 120 and bonding the third bonding layer 160 to the first bonding layer 60. As such, the process for bonding the second light emitting layer 120 to the first light emitting layer 20 may be similar to the process described above in relation to the first embodiment. For example, oxide bonding, tap bonding, or polymer (adhesive) bonding may be used to in any of the substrate bonding process described for the second embodiment. An example of the second bonding layer according to the second embodiment bonded to the first light emitting layer 20 is shown in FIG. 11.

Figure 12:
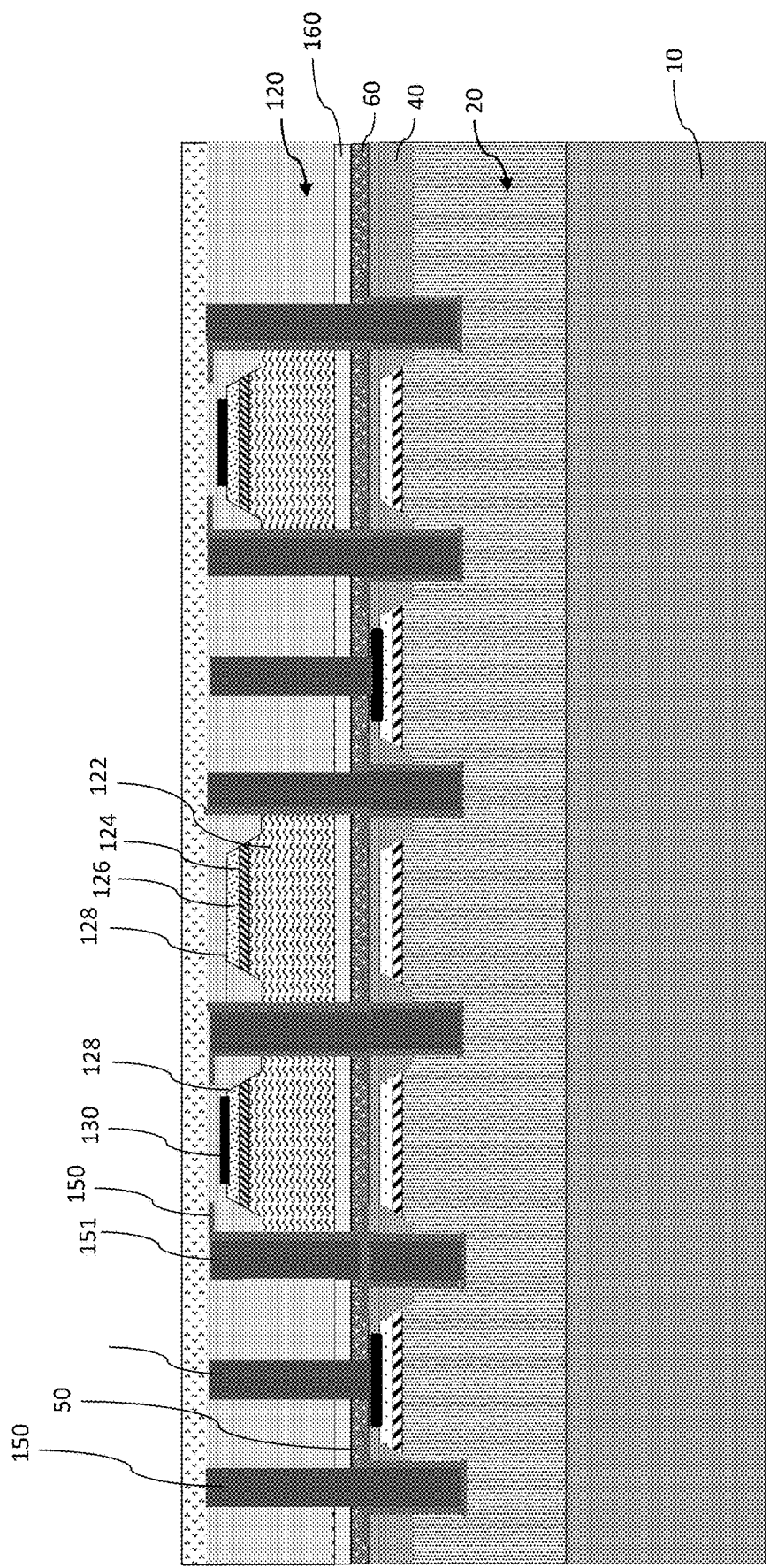
FIG. 12 shows a cross-sectional diagram of the formation of electrical contacts between the first and second light emitting layers according to another embodiment of the disclosure.

Following the bonding of the second light emitting layer 120 to the first light emitting layer 20, the second light emitting layer 120 may be further processed to form an array of second light emitting devices within the second light emitting layer. As such, the process of forming the second light emitting devices in the second light emitting layer 120 may be similar to the process described above in relation to the first embodiment. An example of such a structure following the formation of the second light emitting devices in the second light emitting layer 120 is shown in FIG. 12. As shown in FIG. 12, the second light emitting layer 120 is selectively removed in regions of the light emitting device array precursor which are aligned with the light emitting devices of the first light emitting layer 20. Subsequently, electrical contacts (second anode contacts 130, and second cathode contacts 150 are formed to the second light emitting layer 120). The second cathode contacts 150 also make electrical connection to the first cathode contacts 50 in a similar manner to the first and second cathode contacts 50,150 of the first embodiment.

Figure 13:
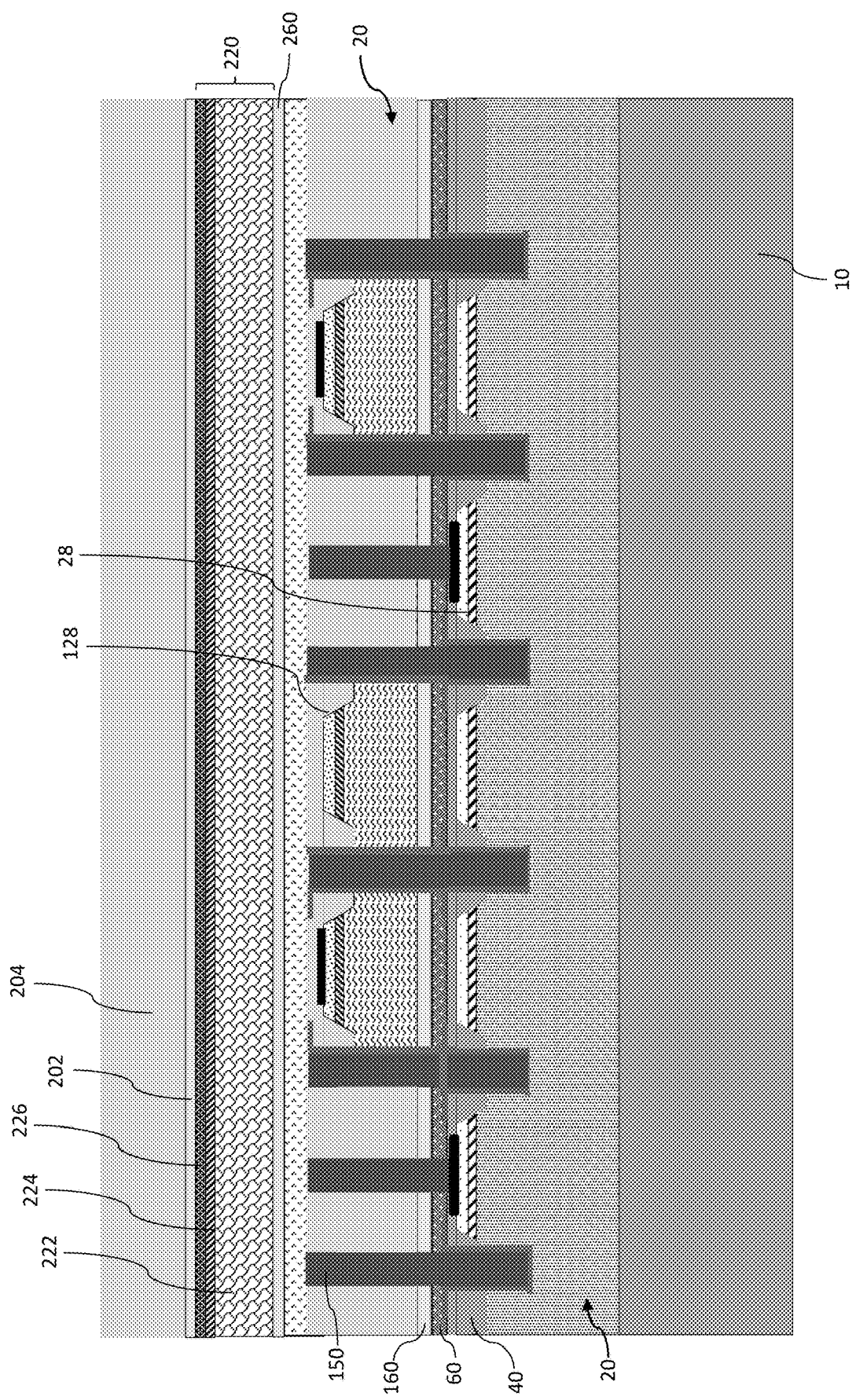
FIG. 13 shows a cross-sectional diagram of the structure of FIG. 12 which has been bonded to a third light emitting layer.

Next, as shown in FIG. 13, a fourth bonding layer 165 may be formed over the second light emitting layer 120 on a side of the second light emitting layer 120 which is opposite to the side of the second light emitting layer and with the first light emitting layer 20 is provided. The fourth bonding layer 165 is configured to bond the second light emitting layer to a third light emitting layer 220. Similar to the first bonding layer 60, the fourth bonding layer 165 is provided over the second light emitting layer 120, the second anode contacts 130 and the second cathode contacts to provide surface for bonding the second light emitting layer 120 to another substrate (e.g. the third light emitting layer 220).

The third light emitting layer 220 may be formed on a third substrate (not shown) in a similar manner to the formation of the second light emitting layer 120 on the second substrate 110. The third light emitting layer 220 may then be transferred to a further handling substrate 204 by way of a fifth bonding layer 202 formed on the third light emitting layer 220, similar to the method described above in relation to the second light emitting layer 120. The third light emitting layer 220 may then be bonded to the second light emitting layer 120 by the application of a sixth bonding layer 260 to the third light emitting layer 220 followed by bonding the fifth light emitting layer 260 to the fourth light emitting layer 165. Thus, the method according to the second embodiment comprises the bonding of a first light emitting layer 20 to a second light emitting layer 120, followed by the boding of the second light emitting layer 120 to the third light emitting layer 220. As such, a stack of light emitting layers is provided in which the second light emitting layer 120 is arranged between the first light emitting layer 20 and the third light emitting layer 220. Of course, it will be appreciated that this is one possible arrangement of the arrangement of the first, second and third light emitting layers 20,120,220. It will be appreciated that the present disclosure is not limited to any specific arrangement of the three layers. As such, the first, second and third light emitting layers 20, 120, 220 may be arranged in any order.

In a similar manner to the second embodiment, the third light emitting layer 220 may be thinned down from an as deposited thickness to a thickness of no greater than 2 μm. In some embodiments, the third light emitting layer 220 may be thinned down from an as deposited thickness to a thickness of no greater than 1.5, 1.4 μm, 1.2 μm, or 1 μm. By thinning down the third light emitting layer 220 to a desired thickness, any damage to the light emitting layer 220 resulting from removal of the fourth bonding layer 202 may be removed, prior to bonding the third light emitting layer 220 to the second light emitting layer 120. In some embodiments, the third light emitting layer 220 may be thinned down from an as deposited thickness to a thickness of at least 0.8 μm. Accordingly, the third light emitting layer 220 may be provided with a thickness which allows the third light emitting layer 220 to be more easily transferred to the second light emitting layer 120.

The third light emitting layer may have a similar structure to the first and second light emitting layers 20, 120. Accordingly, the third light emitting layer 220 according to the second embodiment comprises a third n-type semiconducting layer 220, a third active layer 224, and a third p-type semiconducting layer 226.

Similar to the second light emitting layer 120, the third active layer 224 may comprise one or more quantum well layers. As such, the third active layer 224 may be a multiple quantum well layer. The quantum well layers within the third active layer 224 may comprise a Group-III nitride semiconductor, preferably a Group-III nitride alloy comprising In. For example, in the arrangement shown in FIG. 13, the third active layer 224 may comprise alternating layers of GaN and $In_AGa_{1-A}N$ where $0<A\leq 1$. In particular, in some embodiments the third active layer 224 may comprise InGaN layers where $0.2\leq A\leq 0.5$. As such, the third active layer 224 of the third light emitting layer 220 may be configured to generate light having a wavelength of at least 490 nm and no greater than 670 nm. In particular, in some preferred embodiments where A>0.2, the third light emitting layer may be configured to generate light having a wavelength of at least 540 nm. The thickness and In-content (A) of the quantum well layers of the third active layer 224 may be controlled in order to control the wavelength of light generated by the third active layer 224.

Following the formation and bonding of the third light emitting layer 220 to the second light emitting layer 120, the handling substrate 104 may be removed. The process for removing the handling substrate 104 may be a process which is similar to the process used in relation to the first embodiment.

Figure 14:
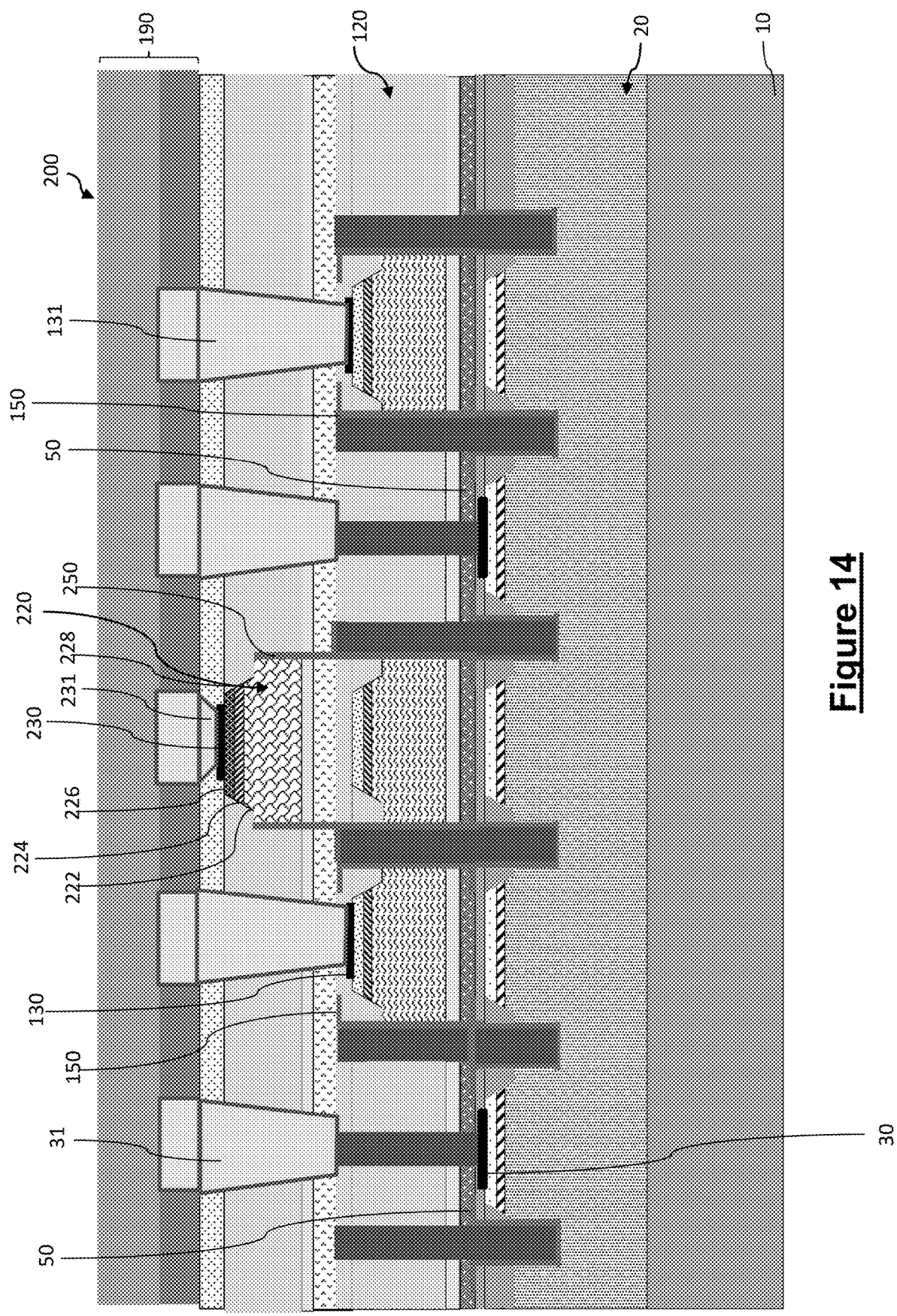
FIG. 14 shows a cross-sectional diagram of the structure of FIG. 13, further processed to form electrical contacts to each of the first, second and third light emitting layers.

Following the removal of the handling substrate 104 the third light emitting layer 220 may be further processed in order to define array of third light emitting devices. Each third light emitting device may be formed in the third light emitting layer 220 by forming the third mesa structures 228 in the third light emitting layer 220. An example of a third mesa structure 228 is shown in FIG. 14. The formation of the third mesa structures 228 in the third light emitting layer 220 is aligned with the light emitting devices already formed in the first and second light emitting layers 20, 120. Similar to the first and second mesa structures 28, 128, the third mesa structures 228 define a trapezoidal cross-section with including sidewall surfaces 229.

As shown in FIG. 14, the first, second and third light emitting devices are arranged in the respective light emitting layers 20, 120, 220 in order to provide an image plane wherein the first second and third light emitting devices are spaced apart from each other with a pitch between adjacent light emitting devices. In some embodiments, the pitch (measured between the centres) between adjacent light emitting devices may be greater than: 100 μm, 50 μm, 30 μm, 20 μm, or 10 μm.

Following the formation of the third mesa structures 228, the anode contacts 230 and third cathode contacts 250 may be formed for the third light emitting layer 220. The processes for forming the third anode contacts 230 and third cathode contacts 250 may be similar to the processes for forming the first and second cathode 50, 150 and anode contacts 30, 130 of the first embodiment. Examples of the third anode contacts 230 and the third cathode contacts 250 are shown in FIG. 14.

Thus, according to a second embodiment of the disclosure, a light emitting array precursor 200 may be provided. The light emitting array precursor 200 includes anode and cathode contacts which have been formed to each of the first, second and third light emitting device layers 20, 120, 220. Of course, in other embodiments, the first, second, and third light emitting layer 20, 120, 220, may be formed (and processed to include light emitting devices), prior to the formation of electrical contacts to each of the layers.

Similar to the first embodiment, the light emitting array precursor 200 may also be subjected to further processing steps.

For example, similar to the first embodiment, unused portions of the third light emitting layer 220 may be selectively removed. The selective removal of said portions allows for the easier formation of electrical interconnections to the first and second light emitting layers 20, 120.

Figure 15:
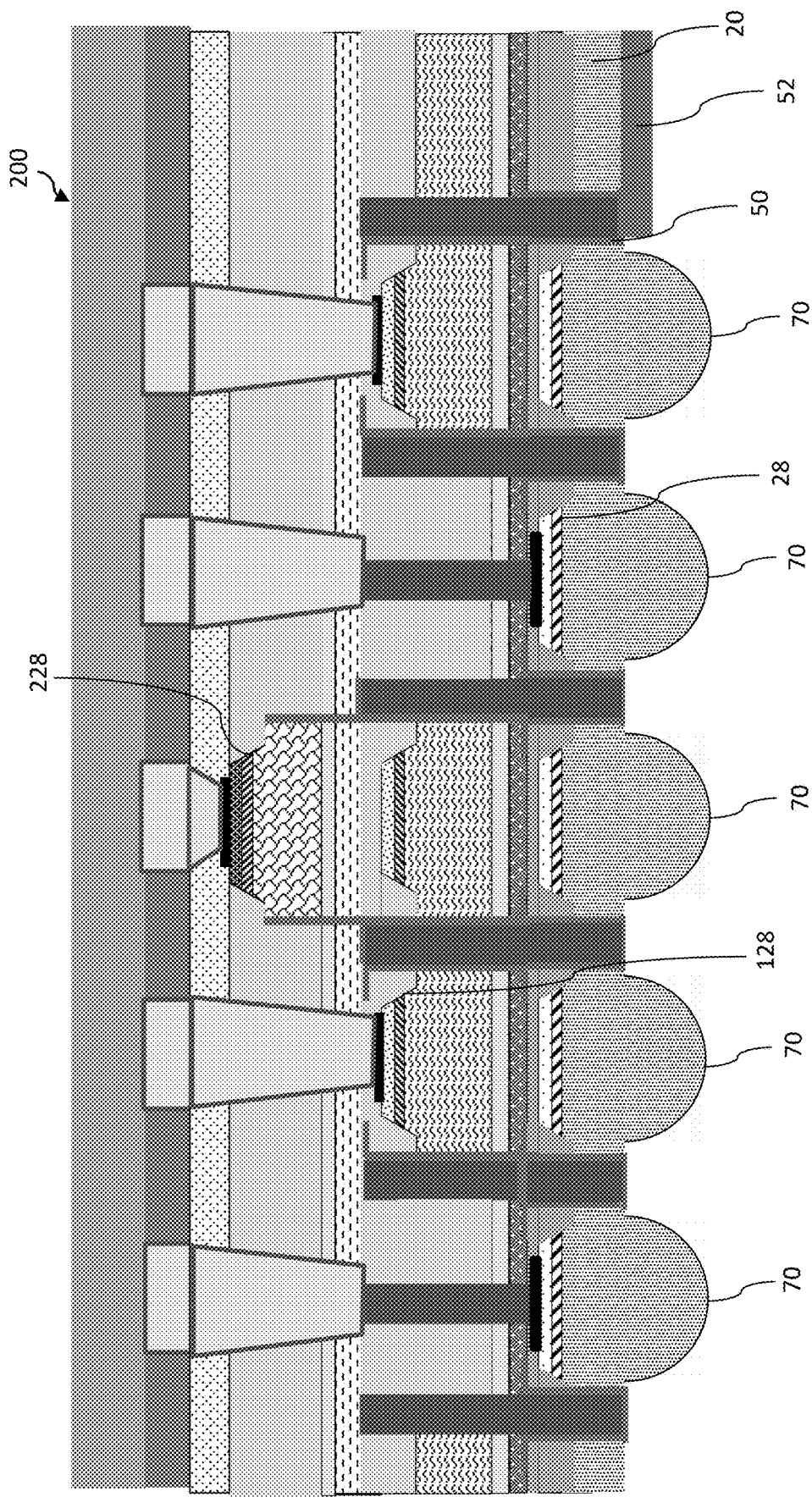
FIG. 15 shows the formation of light extraction features for each of the light emitting devices according to another embodiment of the disclosure.

Further, following the formation of the third anode and cathode contacts 230, 250, the third light emitting device layer 220 may be subjected to further processing steps such as the formation of electrical vias (first, second, and third electrical vias 31, 131, 231) and the bonding of the first, second and third light emitting layers 20, 120, 220 to a back plane electronics substrate 190 may similar process for bonding a back plane electronics substrate to the light emitting device array precursor 200 has already been described in relation to the first embodiment. An example of such a structure is shown in FIG. 15.

Thus, according to embodiments of this disclosure, a light emitting device array precursor 100, 200 and a method of forming a light emitting device array precursor are provided. The light emitting device array precursors 100, 200 of this disclosure include a plurality of native light emitting layers, each layer comprising an array of light emitting devices configured to emit light of a different wavelength. Thus, a multi-colour array of light emitting devices may be provided. According to methods of this disclosure, the separate light emitting layers are bonded together without requiring relatively precise mechanical alignment of different layers of light emitting devices. This in turn reduces or eliminates the requirement for precise mechanical alignment of semiconductor layers during the formation of the light emitting device array precursor. Reducing or eliminating such precise mechanical alignment steps is particularly advantageous for small pitch devices such as micro light emitting devices having a surface area of less than 100 µm×100 µm. Reducing the need for precise mechanical alignment of layers is particularly advantageous for such small devices such as micro LEDs as it produces the amount of tolerance to be provided between each light emitting device which may become significant as the device is reduced.

The light emitting device array precursors according to this disclosure comprise multiple light emitting device layers each configured to emit light at a different wavelength. As such, the light emitting device array precursors and the method of forming thereof provide a means by which a native multicolour (i.e. red, green, blue) display may be provided.

Although embodiments of this disclosure have been described herein in detail, it will be understood by those skilled in the art that variations made thereto without departing from the scope of the invention defined by the appended claims.

The invention claimed is:

1. A method of forming a light emitting device array precursor comprising:
    forming a first light emitting layer on a first substrate, the first light emitting layer configured to emit light having a first wavelength;
    forming an array of first light emitting devices from the first light emitting layer, each first light emitting device configured to emit light having a first wavelength;
    forming a first bonding layer on the first light emitting layer;
    forming a second light emitting layer on a second substrate, the second light emitting layer configured to emit light having a second wavelength different to the first wavelength;
    forming a second bonding layer on the second light emitting layer;
    bonding the second bonding layer to a handling substrate;
    removing the second substrate from the second light emitting layer;
    forming a third bonding layer on the second light emitting layer on an opposite side of the second light emitting layer to the handling substrate;
    bonding the first bonding layer to the third bonding layer;
    removing the handling substrate from the second light emitting layer; and
    forming an array of second light emitting devices from the second light emitting layer, the array of second light emitting devices aligned relative to the array of first light emitting devices such that the light emitting device array precursor comprises an array of first and second light emitting devices which are spaced apart from each other in a plane parallel to each of the first and second light emitting layers.

2. The method according to claim 1, wherein
    the first light emitting layer comprises a plurality of layers, each layer comprising a Group III-nitride; and/or
    the second light emitting layer comprises a plurality of layers, each layer comprising a Group III-nitride.

3. The method according to claim 1, wherein forming the array of first light emitting devices comprises forming a first mesa structure for each first light emitting device.

4. The method according to claim 1, wherein forming the first light emitting layer comprises:
    forming a first n-type semiconducting layer on the first substrate;
    forming a first active layer on the first n-type semiconducting layer, the first active layer comprising a plurality of quantum well layers configured to emit light of the first wavelength; and
    forming a first p-type semiconducting layer on the first active layer.

5. The method according to claim 4, wherein forming the array of first light emitting devices comprises forming a first mesa structure for each first light emitting device, wherein the first mesa structures formed extend in a direction normal to the first substrate, wherein each first mesa structure comprises a portion of the first n-type semiconducting layer, the first active layer, and the first p-type semiconducting layer.

6. The method according to claim 1, wherein forming the second light emitting layer comprises:
    forming a second n-type semiconducting layer on the second substrate;
    forming a second active layer on the second n-type semiconducting layer, the second active layer comprising a plurality of quantum well layers configured to emit light of the second wavelength; and
    forming a second p-type semiconducting layer on the second active layer.

7. The method according to claim 6, wherein following removal of the second substrate and prior to the formation of the third bonding layer, selectively removing a portion of the second n-type semiconducting layer such that a thickness of the second n-type semiconducting layer in a direction normal to the handling substrate is no greater than 2 µm.

8. The method according to claim 6, wherein forming the array of second light emitting devices from the second light emitting layer comprises forming a second mesa structure for each second light emitting device, the second mesa structures extending in a direction normal to the first substrate, wherein each second mesa structure comprises a portion of the second n-type semiconducting layer, the second active layer, and the second p-type semiconducting layer.

9. The method according to claim 1, further comprising:
    forming electrical contacts to each of the first light emitting devices and each of the second light emitting devices.

10. The method according to claim 2, wherein forming electrical contacts to each of the first light emitting devices and each of the second light emitting devices comprises forming a common cathode contact to each of the first and second light emitting devices.

11. The method according to claim 1, wherein
    the first bonding layer comprises a dielectric material, and
    the third bonding layer comprises a dielectric material, and bonding the first bonding layer to the third bonding layer comprises direct bonding the first bonding layer to the third bonding layer by applying pressure and heat.

12. The method according to claim 1, wherein the first wavelength is shorter than the second wavelength.

13. The method according to claim 12, wherein the first wavelength is at least 440 nm and no greater than 490 nm.

14. The method according to claim 12, wherein the second wavelength is at least 500 nm and no greater than 680 nm.

15. The method according to claim 1, further comprising:
forming a fourth bonding layer on the second light emitting layer;
forming a third light emitting layer on a third substrate, the third light emitting layer configured to emit light having a third wavelength different to the first wavelength and different to the second wavelength;
forming a fifth bonding layer on the third light emitting layer;
bonding the fifth bonding layer to a further handling substrate;
removing the third substrate from the third light emitting layer;
forming a sixth bonding layer on the third light emitting layer on an opposite side of the third light emitting layer to the further handling substrate;
bonding the fourth bonding layer to the sixth bonding layer;
removing the further handling substrate from the third light emitting layer; and
forming an array of third light emitting devices from the third light emitting layer, the array of third light emitting devices aligned relative to the array of first light emitting devices and the array second light emitting device such that the light emitting device array precursor comprises an array of first second, and third light emitting devices which are spaced apart from each other.

16. The method according to claim 15, wherein the third light emitting layer comprises a plurality of layers, each layer comprising a Group III-nitride.

17. The method according to claim 15, wherein forming the array of third light emitting devices comprises forming a third mesa structure for each third light emitting device.

18. The method according to claim 15, wherein forming the third light emitting layer comprises:
forming a third n-type semiconducting layer on the third substrate;
forming a third active layer on the first n-type semiconducting layer, the third active layer comprising a plurality of quantum well layers configured to emit light of the third wavelength; and
forming a third p-type semiconducting layer on the third active layer.

* * * * *